United States Patent
Kim et al.

(10) Patent No.: US 10,062,316 B2
(45) Date of Patent: Aug. 28, 2018

(54) NON-RECTANGULAR DISPLAY APPARATUS

(71) Applicant: SAMSUNG DISPLAY CO., LTD., Yongin-si, Gyeonggi-do (KR)

(72) Inventors: Il-joo Kim, Hwaseong-si (KR); Mukyung Jeon, Ulsan (KR); Ansu Lee, Seoul (KR)

(73) Assignee: SAMSUNG DISPLAY CO., LTD., Yongin-si, Gyeonggi-do (KR)

( * ) Notice: Subject to any disclaimer, the term of this patent is extended or adjusted under 35 U.S.C. 154(b) by 72 days.

(21) Appl. No.: 15/378,715

(22) Filed: Dec. 14, 2016

(65) Prior Publication Data

US 2017/0337865 A1 Nov. 23, 2017

(30) Foreign Application Priority Data

May 23, 2016 (KR) ........................ 10-2016-0063019

(51) Int. Cl.
*G09G 3/20* (2006.01)
*G02F 1/1362* (2006.01)

(52) U.S. Cl.
CPC ..... *G09G 3/2092* (2013.01); *G02F 1/136286* (2013.01); *G02F 2201/56* (2013.01); *G09G 2300/0426* (2013.01)

(58) Field of Classification Search
CPC .......... G09G 3/2092; G09G 2300/0426; G02F 1/136286; G02F 2201/56
See application file for complete search history.

(56) References Cited

U.S. PATENT DOCUMENTS 8,994,795 B2    3/2015  Oh
9,837,038 B2 *  12/2017 Lee ..................... G09G 3/3688

FOREIGN PATENT DOCUMENTS

| JP | 2006-276361 A | 10/2006 |
|---|---|---|
| JP | 2007-114569 A | 5/2007 |
| JP | 2008-292995 A | 12/2008 |
| JP | 2009-069768 A | 4/2009 |
| JP | 2009-128420 A | 6/2009 |
| JP | 2009-134246 A | 6/2009 |
| KR | 10-2015-0012143 A | 2/2015 |

* cited by examiner

*Primary Examiner* — Larry Lee
(74) *Attorney, Agent, or Firm* — Lee & Morse, P.C.

(57) ABSTRACT

A display apparatus includes a plurality of pixels arranged in rows and columns, a plurality of gate lines in a first direction and connected to the pixels, and a plurality of data lines connected to the pixels. A number of data lines are between pixels in one row and in each of first areas adjacent to one side of the pixels in one column of a first column and the last column.

20 Claims, 18 Drawing Sheets

NON-RECTANGULAR DISPLAY APPARATUS

CROSS-REFERENCE TO RELATED APPLICATION

Korean Patent Application No. 10-2016-0063019, filed on May 23, 2016, and entitled, "Display Apparatus," is incorporated by reference herein in its entirety.

BACKGROUND

1. Field

One or more embodiments described herein relate to a display apparatus.

2. Description of the Related Art

A variety of displays have been developed. Examples include liquid crystal displays, organic light emitting displays, electro wetting displays, plasma displays, and electrophoretic displays. All of these displays have been made to have a rectangular shape, which determines the arrangement of their signal lines.

For example, displays having a rectangular shape may include a plurality of gate lines (or scan lines) extending in a row direction, a plurality of data lines extending in a column direction, and a plurality of pixels connected to the gate lines and the data lines. The pixels receive data voltages through the data lines based on gate signals received through the gate lines, and then emit light of corresponding gray scales.

SUMMARY

In accordance with one or more embodiments, a display apparatus includes a display panel including: a plurality of pixels arranged in rows and columns; a plurality of gate lines in a first direction and connected to the pixels; and a plurality of data lines connected to the pixels, wherein k pixels are in an a-th row of the rows, n pixels are in each of an e-th row to an f-th row of the rows between a first row and an m-th row that is a last row, and a number of pixels greater than k and less than n are in each of other or remaining rows, where the a, k, e, f, m, and n are natural numbers and the f is equal to or greater than the e, and wherein L data lines are between pixels in the a-th row and in each of first areas adjacent to one side of the pixels in one column of a first column and the last column of the a-th row, wherein L is based on a value obtained by dividing n by k, and wherein L is a natural number. The k pixels may be in the m-th row. The display panel may have a circular shape. The value of a may be 1.

In the rows between the first row and the e-th row, a number of pixels in a present row is equal to or greater than a number of pixels in a former row, and in the rows between the f-th row and the m-th row, a number of pixels in a present row is equal to or less than a number of pixels in a former row.

The data lines include a plurality of data line groups that respectively include the L data lines, straight data lines are first data lines of each of the data line groups; bent data lines are data lines except for the straight data lines, the data lines extend in a second direction crossing the first direction in the first areas, the straight data lines extend in the second direction, the bent data lines extend in the second direction, the first direction, and the second direction in the first row to the e-th row to extend from the e-th row in the second direction, the first direction corresponds to a row direction, and the second direction corresponds to a column direction.

The k pixels in the first row are in a g-th column to a p-th column between a first column and an n-th column that is a last column of the columns, and each of the straight data lines is connected to pixels in a corresponding column of the g-th column to the p-th column, with g, p, and n being natural numbers. The first areas are between the pixels in the first row and adjacent to a right side of the p-th column of the first row.

The bent data lines successively extend from the second direction to the first direction, while an order of the bent data lines increases from a first bent data line, and successively extend from the second direction to the first direction, while the order of the bent data lines decreases from a v-th bent data line that is the last bent data line. The bent data lines extending in the first direction successively extend from the first bent data line and successively extend from the first direction to the second direction from the v-th bent data line, and each of the bent data lines extending from the first direction to the second direction is connected to the pixels in a corresponding column of the first column to a g−1-th column and a p+1-th column to the n-th column.

The bent data lines extending from the first direction to the second direction are successively connected by a column unit to the pixels in the g−1-th column to the first column and successively connected by the column unit to the pixels in the p+1-th column to the n-th column from the v-th bent data line. In the first row to the e-th row, when the number of pixels in an h-th row and the number of pixels disposed in an h+1-th row are different from each other, the bent data lines having a same number as a difference value between the number of pixels in the h-th row and a number of pixels in the h+1-th row of the bent data lines extend in the first direction between the pixels in the h-th row and the pixels in the h+1-th row, where h is a natural number.

In a left area of the display panel, which is an area of the display panel at a left side with respect to a central portion of the display panel in the first direction and the first row to the e-th row, when a number of pixels in an h+1-th row is greater by c than a number of pixels in an h-th row, c bent data lines extend in the first direction between the pixels in the h-th row and the pixels in the h+1-th row, and in a right area of the display panel, which is an area of the display panel at a right side with respect to the central portion of the display panel in the first direction and the first row to the e-th row, when a number of pixels in the h+1-th row is greater by d than a number of pixels in the h-th row, d bent data lines extend in the first direction between the pixels in the h-th row and the pixels in the h+1-th row.

The data lines adjacent to each other of the L data lines in each of the first areas are spaced a first distance from each other in the first direction and have a predetermined width in the first direction, and a pitch corresponding to a distance between sides of the data lines adjacent to each other is determined as a value obtained by adding the first distance to the width.

A second distance, between the pixels adjacent to each other in the second direction in the display panel, is equal to or greater than a value obtained by multiplying the pitch by a maximum value of a difference value in number of pixels in the rows adjacent to each other on the left area of the display panel and in the first row to the e-th row or a difference value in number of pixels in the rows adjacent to each other in the right area of the display panel and the first row to the e-th row. A data line in the second direction crosses at least one data line in the first direction.

The at least one data line in the first direction includes a bridge electrode spaced apart from the one data line in the second direction with an insulation layer therebetween; and first and second sub lines spaced apart from each other with the one data line extending in the second direction therebetween, wherein the bridge electrode electrically connects the first sub line to the second sub line.

The display apparatus includes a gate driver connected to the gate lines to apply a plurality of gate signals to the gate lines; and a data driver adjacent to the first row and connected to the data lines to apply a plurality of data voltages to the data lines. When a=1, a number of pixels greater than k are in the m-th row, the number of pixels in each of the rows between the first row and the e-th row is greater than the k and less than the n, and the number of pixels in each of the rows between the f-th row and the m-th row is less than the n and greater than the r, where the r is a natural number.

The display panel includes a first side extending in the first direction; a second side extending the first direction, facing the first side, and having a length less than that of the first side; a third side to connect one side of the first side to one side of the second side; and a fourth side to connect the other side of the first side to the other side of the second side, wherein each of a predetermined area of each of different sides of the third side and a predetermined area of different sides of the fourth side has a curved shape that protrudes to the outside of the display panel. The a-th row includes a row between the first row and the m-th row.

The n pixels are in the e-th row to the f-th row of the rows between the first row and the a-th row and a q-th row to an u-th row of the rows between the a-th row and the m-th row, a number of pixels greater by r than k are in each of the first row and the m-th row, a number of pixels greater than the k and less than the n are in each of the rows between the a-th row and the q-th row and the rows between the a-th row and the f-th row, and a number of pixels greater than the r and less than the are in each of the rows between the first row and the e-th row and the rows between the u-th row and the m-th row, where q, u, r are natural numbers, and u is equal to or greater than q.

In the rows between the first row and the e-th row, a number of pixels in a present row is equal to or greater than a number of pixels in a former row, and in rows between the f-th row and the a-th row, a number of pixels in a present row is equal to or less than a number of pixels in a former row, in the rows between the a-th row and the q-th row, a number of pixels in a present row is equal to or greater than a number of pixels in a former row, and in rows between the u-th row and the m-th row, a number of pixels in a present row is equal to or less than a number of pixels in a former row, and the pixels are vertically symmetrical to each other with respect to the a-th row.

A number of pixels in rows on a right area of the display panel, which is an area of the display area at a right side with respect to a central portion of the display panel in the first direction, have a same number. The data lines include a plurality of data line groups that respectively include L data lines, straight data lines are first data lines of each of the data line groups; bent data lines are the data lines except for the straight data lines; and the data lines extend in a second direction crossing the first direction in the first areas, the straight data lines extend in the second direction and are connected to the pixels in a corresponding row of the rows, the bent data lines are connected to the pixels in a corresponding row of the rows, while being bent at least two times from the second direction to the first direction and from the first direction to the second direction.

In the first row to the q-th row, when a difference value between a number of pixels in an h-th row and a number of pixels in an h+1-th row is z, z bent data lines extend in the first direction between the pixels in the h-th row and the pixels in the h+1-th row, where h and z are natural numbers. In the f-th row to the a-th row, when a difference value between a number of pixels in the h-th row and a number of pixels in the h+1-th row is z, z bent data lines extend in the first direction between the pixels in the h-th row and the pixels in the h+1-th row, and each of the z bent data lines extends from the first direction to the second direction and is connected to the pixels in a corresponding column.

In the e-th row to the first row, when a difference value between a number of pixels in the h-th row and a number of pixels in the h+1-th row is z, z bent data lines extend in the first direction between the pixels in the h-th row and the pixels in the h+1-th row, the z bent data lines extending in the first direction extend in the second direction at positions corresponding to bent data lines in the a-th row, and the bent data lines successively extend in the first direction from the bent data line that is at a leftmost side.

In the a-th row to the q-th row, when a difference value between a number of pixels in the h-th row and a number of pixels in the h+1-th row is z, z bent data lines extend in the first direction between the pixels in the h-th row and the pixels in the h+1-th row, and each of the z bent data lines extending in the first direction extends in the second direction and is connected to the pixels in the corresponding column. The data lines adjacent to each other of the L data lines in each of the first areas are spaced a first distance from each other in the first direction and have a predetermined width in the first direction, and a pitch corresponding to a distance between sides of the data lines adjacent to each other is determined as a value obtained by adding the first distance to the width, and a second distance between the pixels adjacent to each other in the second direction in the display panel is equal to or greater than a value obtained by multiplying the pitch by a maximum value of difference values in number of pixels in the rows adjacent to each other in the first row to the q-th row by the pitch.

When a=1, k pixels are in the m-th row, the data lines extend in a second direction crossing the first direction, an intermediate data line of the data lines extends in the second direction, bent data lines corresponding to other or remaining data lines except for the intermediate data line are bent at least two times from the second direction to the first direction and from the first direction to the second direction to extend, and in the first row to the e-th row, as a number of rows increases, a number of bent data lines bent to extend in the first direction increases, the bent data lines extend from the e-th row in the second direction and the bent data lines are symmetrical to each other with respect to the intermediate data line.

In a first row to an e−1-th row, each of the pixels is connected to a corresponding bent data line of the bent data lines, and in the e-th row to an m-th row, each of the data lines is connected to the pixels in a corresponding row of the rows. In a left area of the display panel, which is an area of the display panel at a left side with respect to a central portion of the display panel in the first direction and the first row to the e-th row, the number of pixels in an h+1-th row is greater by c than that of pixels in an h-th row, in a right area of the display panel, which is an area of the display panel at a right side with respect to the central portion of the display panel in the first direction and the first row to the e-th row, the number of pixels in the h+1-th row is greater by d than that of pixels disposed in the h-th row, when c and d are equal, in the first row to the e-th row, line routing parts having a number equal to a value obtained by adding 1 to one value of c and d are between pixels in the h-th row and pixels in the h+1-th row, when c and d are different, the line routing parts having a number equal to a value obtained by adding 1 to one a value of c or d is defined between pixels in the h-th row and the pixels in the h+1-th row, and in the first row to the e-th row, the bent data lines extending in the first direction between the pixels in the h-th row and the pixels in the h+1-th row extend via the line routing parts.

The data lines adjacent to each other of L data lines on each of the first areas are spaced a first distance from each other in the first direction and have a predetermined width in the first direction, and a pitch corresponding to a distance between sides of the data lines adjacent to each other is determined as a value obtained by adding the first distance to the width, and a second distance between the pixels adjacent to each other in the second direction in the display panel is equal to or greater than a value obtained by multiplying the pitch by a value calculated by adding one to a maximum value of a difference value in number of pixels in the rows adjacent to each other on the left area of the display panel and in the first row to the e-th row and a difference value in number of pixels in the rows adjacent to each other in the right area of the display panel and the first row to the e-th row.

In accordance with one or more other embodiments, a display apparatus includes a display panel including: a plurality of pixels arranged in rows and columns; a plurality of gate lines extending in a first direction and connected to the pixels; and a plurality of data lines connected to the pixels, wherein k pixels are in an a-th row of the rows, n pixels are in each of an e-th row to an f-th row of the rows between a first row and an m-th row that is a last row, and a number of pixels greater than k and less than n are in each of other or remaining rows, where a, k, e, f, m, and n are natural numbers and the f is equal to or greater than the e, and a value obtained by dividing n by k is L, a remaining value is b, L+1 data lines are in each of b first areas of the first areas corresponds to an area between the pixels in the a-th row and adjacent to one side of the pixel in one column of a first column to the last column of the a-th row. The L+1 data lines are successively disposed in w first areas from a leftmost side and successively in b-w first areas from a rightmost side of the first areas, where w is an integer equal to or greater than 0 and is equal to or less than the b.

In accordance with one or more other embodiments, a display apparatus includes a display panel including: a plurality of pixels arranged in rows and columns; a plurality of gate lines extending in a first direction and connected to the pixels; and a plurality of data lines connected to the pixels, wherein k pixels are in an a-th row of the rows, n pixels are in each of an e-th row to an f-th row of the rows between a first row and an m-th row that is a last row, and a number of pixels greater than k and less than n are in each of other or remaining rows, where a, k, e, f, m, and n are natural numbers and the f is equal to or greater than the e, L data lines are in each of first areas corresponding to an area between the pixels in the first row and adjacent to one side of the pixel in one column of a first column to the last column of the a-th row, and in the first row to the e-th row, a number of data lines equal to a difference value between a number of pixels in an h-th row and a number of pixels in an h+1-th row of the data lines extend in the first direction between pixels in the h-th row and pixels in the h+1-th row, where L and h are natural numbers. L is a value obtained by dividing n by k, with L being a natural number.

The data lines include a plurality of data line groups that respectively include L data lines, straight data lines are first data lines in the data line groups; bent data lines are data lines except for the straight data lines, wherein the data lines extend in a second direction crossing the first direction on the first areas, the straight data lines extend in the second direction, the bent data lines extend in the second direction, the first direction, and the second direction in the first row to the e-th row to extend from the e-th row in the second direction, and the first direction corresponds to a row direction and the second direction corresponds to a column direction.

In a left area of the display panel, which is as an area of the display panel at a left side with respect to a central portion of the display panel in the first direction and the first row to the e-th row, when a number of pixels in an h+1-th row is greater by c than a number pixels disposed in an h-th row, in the left area of the display panel and the first row to the e-th row, c bent data lines extend in the first direction between pixels in the h-th row and pixels in the h+1-th row, and in a right area of the display panel, which is an area of the display panel at a right side with respect to the central portion of the display panel in the first direction and the first row to the e-th row, when a number of pixels in the h+1-th row is greater by d than a number of pixels in the h-th row, in the right area of the display panel and the first row to the e-th row, d bent data lines extend in the first direction between the pixels in the h-th row and the pixels in the h+1-th row.

The data lines adjacent to each other of L data lines in each of the first areas are spaced a first distance from each other in the first direction and have a predetermined width in the first direction, and a pitch corresponding to a distance between sides of the data lines adjacent to each other is determined as a value obtained by adding the first distance to the width, and a second distance between the pixels adjacent to each other in the second direction is equal to or greater than a value obtained by multiplying the pitch by a maximum value of a difference value in number of pixels in rows adjacent to each other on the left area of the display panel and in a first row to the e-th row or a difference value in a number of pixels in the rows adjacent to each other in the right area of the display panel and a first row to the e-th row.

BRIEF DESCRIPTION OF THE DRAWINGS

Features will become apparent to those of skill in the art by describing in detail exemplary embodiments with reference to the attached drawings in which.

DETAILED DESCRIPTION

Figure 1:
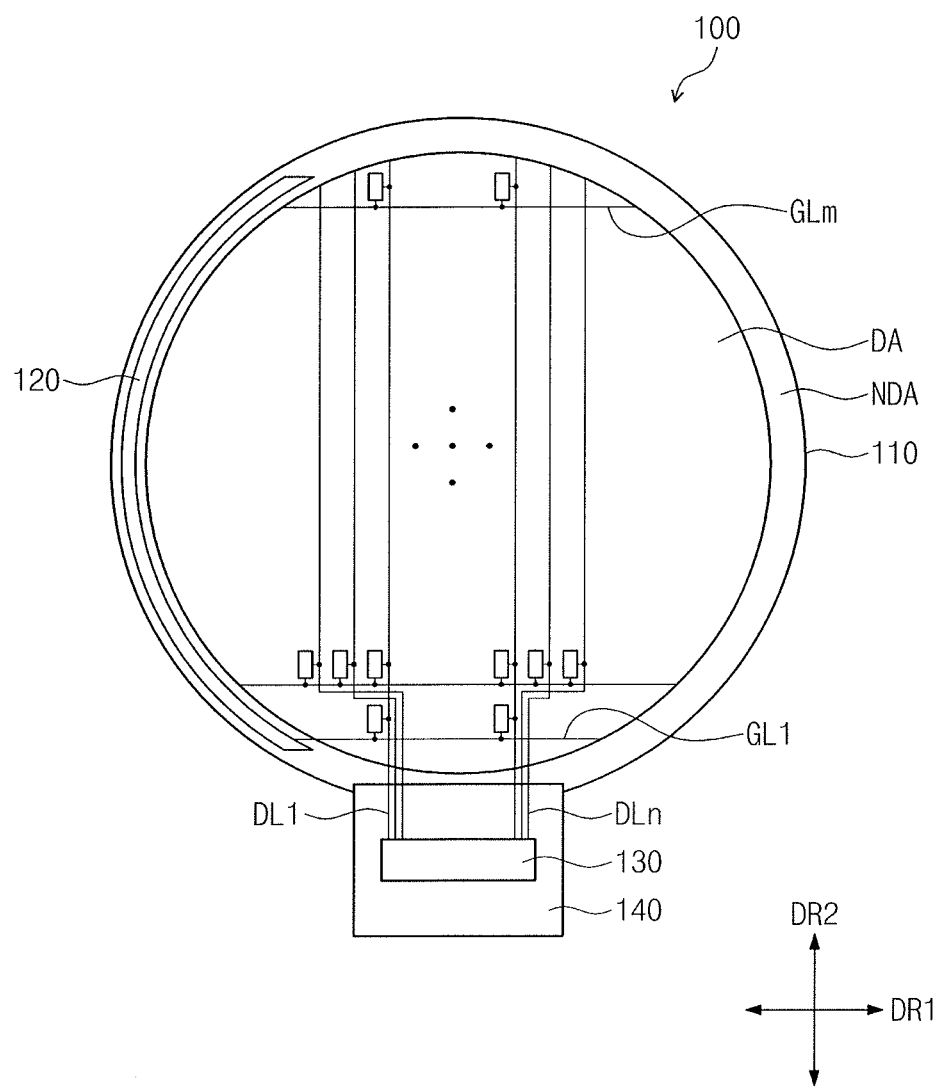
FIG. 1 illustrates an embodiment of a display apparatus.

Example embodiments will now be described with reference to the drawings; however, they may be embodied in different forms and should not be construed as limited to the embodiments set forth herein. Rather, these embodiments are provided so that this disclosure will be thorough and complete, and will fully convey exemplary implementations to those skilled in the art. The embodiments (or portions thereof) may be combined to form additional embodiments.

In the drawings, the dimensions of layers and regions may be exaggerated for clarity of illustration. It will also be understood that when a layer or element is referred to as being "on" another layer or substrate, it can be directly on the other layer or substrate, or intervening layers may also be present. Further, it will be understood that when a layer is referred to as being "under" another layer, it can be directly under, and one or more intervening layers may also be present. In addition, it will also be understood that when a layer is referred to as being "between" two layers, it can be the only layer between the two layers, or one or more intervening layers may also be present. Like reference numerals refer to like elements throughout.

When an element is referred to as being "connected" or "coupled" to another element, it can be directly connected or coupled to the another element or be indirectly connected or coupled to the another element with one or more intervening elements interposed therebetween. In addition, when an element is referred to as "including" a component, this indicates that the element may further include another component instead of excluding another component unless there is different disclosure.

FIG. 1 illustrates an embodiment of a display apparatus 100 which includes a display panel 110, a gate driver 120, a data driver 130, and a flexible circuit board 140. The gate driver 120 may be, for example, a scan driving unit. The display panel 110 may have various shapes, e.g., a circular as in FIG. 1 or another non-rectangular shape.

The display panel 110 may be an organic light emitting display panel including organic light emitting devices or a liquid crystal display panel including a liquid crystal layer. In another embodiment, the display panel 110 may be an electrowetting display panel including an electrowetting layer or an electrophoretic display panel including an electrophoretic layer.

An area on a plane of the display panel 110 may include a display area DA having a circular shape and a non-display area NDA adjacent to or surrounding the display area DA. An outer portion of the non-display area NDA may be circular.

The display panel 110 includes a plurality of pixels PX, a plurality of gate lines GL1 to GLm, and a plurality of data lines DL1 to DLn, where m and n are natural numbers. The pixels PX are arranged in rows and columns in the display area DA and connected to the gate lines GL1 to GLm and the data lines DL1 to DLn. The pixels PX may be arranged in the display area DA in order to allow the display area DA to have a circular shape.

Each of the pixels PX may display one of a predetermined number of colors, e.g., red, green, and blue colors or another combination of colors. For example, in one embodiment, the colors may be white, yellow, cyan, and magenta.

The gate lines GL1 to GLm extend in a first direction DR1 and are connected to the gate driver 120. The gate lines GL1 to GLm and the data lines DL1 to DLn are insulated from and cross each other. The data lines DLl to DLn are connected to the data driver 130. Also, a predetermined number of the data lines DL1 to DLn may extend in a second direction DR2 crossing the first direction DR1. Other or remaining ones of the rest data lines may extend in the second direction DR2, the first direction DR1, and the second direction DR2. The pixels in each row are connected to corresponding data lines of the data lines DL1 to DLn.

The gate driver 120 may be in the non-display area NDA and connected to the gate lines GL1 to GLm. The gate driver 120 may be formed, for example, at the same time and using the same process as transistors of the pixels PX, in the non-display area NDA of the display panel 110.

The gate driver 120 may be mounted in the non-display area NDA of the display panel 110 and may be, for example, an amorphous silicon TFT gate driver circuit (ASG) or an oxide silicon TFT gate driver circuit (OSG). In another embodiment, the gate driver 120 may be embodied within multiple driving chips mounted in the non-display area NDA of the display panel 100, for example, in a chip-on-glass (COG) manner.

The data driver 130 may be embodied in a driving chip mounted on the flexible circuit board 140. The flexible circuit board 140 is connected to the non-display area NDA of the display panel 110. The data driver 130 may be connected to the non-display area NDA of the display panel 110, for example, through the flexible circuit board 140. In one embodiment, the data driver 130 may be mounted in the non-display area NDA of the display panel 110 in a COG manner.

The gate driver 120 generates and successively applies a plurality of gate signals (or scan signals) to the gate lines GL1 to GLm. The data driver 130 generates a plurality of analog-type data voltages to apply the generated data voltage to the data lines DL1 to DLn. The gate signals are provided to the pixels PX through the gate lines GL1 to GLm. The data voltages are provided to the pixels PX through the data lines DL1 to DLn.

The pixels PX receive the data voltages through the data lines DL1 to DLn based on the gate signals received through the gate lines GL1 to GLm. The pixels PX emit light having gray scale values corresponding to the data voltages in order to display an image.

The display apparatus 100 may include a timing controller that provides a gate control signal to the gate driver 120 and a data control signal and image signals to the data driver 130. The timing controller may be mounted, for example, on a printed circuit board and connected to the flexible circuit board 140. The gate driver 120 generates gate signals based on the gate control signal. The data driver 130 generates data voltages corresponding to the image signals based on the data control signal.

Figure 2:
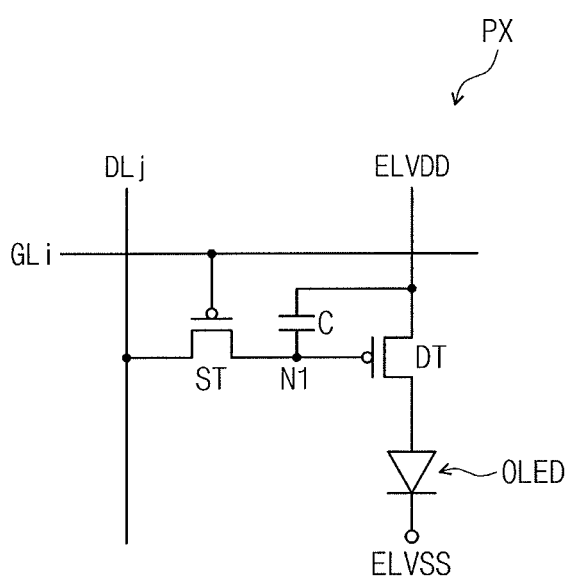
FIG. 2 illustrates an embodiment of a pixel.
Figure 3:
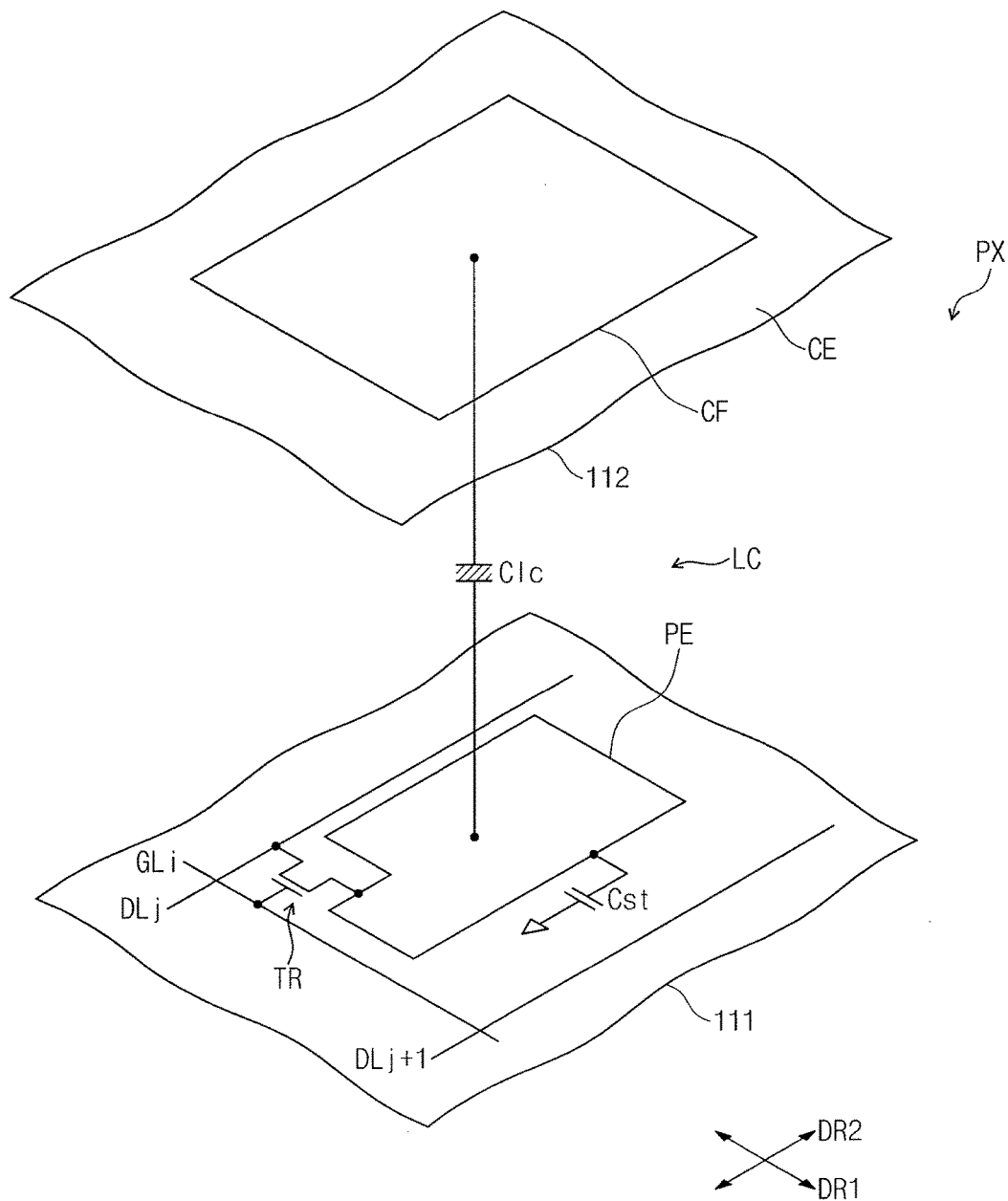
FIG. 3 illustrates another embodiment of a pixel.

FIGS. 2 and 3 illustrate different embodiments of a pixel, which, for example, may be representative of the pixels in display apparatus 100. Referring to FIG. 2, the pixel PX includes a light emitting device OLED, a driving device DT, a capacitance device C, and a switching device ST. When the display panel 110 is an organic light emitting display panel, the display panel 110 may include a plurality of pixels PX.

The light emitting device OLED may be an organic light emitting device including an organic light emitting layer. The capacitance device C may be a capacitor. The driving device DT and the switching device ST may be P-type transistors. In another embodiment, the driving device DT and switching device ST may be N-type transistors.

The driving device DT includes an input terminal connected to a first electrode of the capacitance device C to receive a first power source voltage ELVDD, an output terminal connected to the input terminal (or an anode electrode) of the light emitting device OLED, and a control terminal connected to an output terminal of the switching device ST. A second electrode of the capacitance C is connected to the control terminal of the driving device DT. An output terminal (or a cathode electrode) of the light emitting device OLED receives a second power source voltage ELVSS.

The switching device ST includes an input terminal connected to a corresponding data line DLj of the data lines DL1 to DLn, an output terminal connected to the control terminal of the driving device DT, and a control terminal connected to a corresponding gate line GLi of the gate lines GL1 to GLme, i and j are natural numbers.

The gate signal is applied to the control terminal of the switching device ST through the gate line GLi. The switching device ST is turned on based on the gate signal. The switching device ST, that is turned on provides the data voltage received through the data line DLj, to a first node N1. The capacitance device C charges the data voltage provided to the first node N1 to maintain the charged data voltage even after the switching device ST is turned off.

The driving device DT receives the data voltage charged in the capacitance device C and then is turned on. The driving device DT may be turned on until the data voltage charged in the capacitance device C is fully discharged. The driving device DT that is turned on receives the first power source voltage ELVDD. Thus, current is provided to the light emitting device OLED through the driving device DT to allow the light emitting device OLED to emit light. The light emitting device OLED may emit light to display an image corresponding to the data voltage.

Referring to FIG. 3, in another embodiment, the display panel 110 may be a liquid crystal display panel which includes a first substrate 111, a second substrate 112 facing the first substrate 111, and a liquid crystal layer LC between the first substrate 111 and the second substrate 112.

Each of the pixels PX includes a transistor TR and a storage capacitor Cst connected to a liquid crystal capacitor Clc. The transistor TR is connected to a corresponding gate line GL1 of the gate lines GL1 to GLm and a corresponding data line DLj of the data lines DL1 to DLn. The liquid crystal capacitor Clc is connected to the transistor TR. The storage capacitor Cst connected, in parallel, to the liquid crystal capacitor Clc. In one embodiment, the storage capacitor Cst may be omitted.

The gate line GLi, the data line DLj, and the transistor TR may be on the first substrate 111. The transistor TR includes a gate electrode connected to the gate line GLi, a source electrode connected to the data line DLj, and a drain electrode connected to the liquid crystal capacitor Clc and the storage capacitor Cst.

The liquid crystal capacitor Clc includes a pixel electrode PE on the first substrate 111, a common electrode CE on the second substrate 112 to face the pixel electrode PE, and a liquid crystal layer LC between the pixel electrode PE and the common electrode CE. The liquid crystal layer LC may serve as a dielectric. The pixel electrode PE is connected to the drain electrode of the transistor TR.

In FIG. 3, the pixel electrode PE has a non-slit structure. In another embodiment, the pixel electrode PE may have a slit structure including, for example, a stem part having a cross shape and a plurality of branch parts radially extending from the stem part. The common electrode CE may be disposed over an entire surface of the second substrate 112. In one embodiment, the common electrode CE may be on the first substrate 111. In this case, at least one of the pixel electrode PE or the common electrode CE may have a slit structure.

The storage capacitor Cst may include the pixel electrode PE, a storage electrode branched from a storage line, and an insulation layer between the pixel electrode PE and the storage electrode. The storage line is on the first substrate 111. Also, the storage line and the gate line GLi may be on the same layer at the same time. The storage electrode may partially overlap the pixel electrode PE.

The pixel PX may further include a color filter CF to emit light of, for example, a red, green, or blue color. As an exemplary embodiment, the color filter CF may be on the second substrate 112, for example, as in FIG. 3. In another embodiment, the color filter CF may be on the first substrate 111.

The transistor TR is turned on based on a gate signal provided through the gate line GLi. A data voltage received through the data line DLj is provided to the pixel electrode PE of the liquid crystal capacitor Clc through the transistor TR that is turned on. A common voltage is applied to the common electrode CE.

Electric fields are formed between the pixel electrode PE and the common electrode CE based on a difference in voltage level between the data voltage and the common voltage. Liquid crystal molecules in the liquid crystal layer LC are controlled by the electric fields between the pixel electrode PE and the common electrode CE to emit light to form an image.

A storage voltage having a uniform voltage level may be applied to the storage line. In one embodiment, the common voltage may be applied to the storage line. The storage capacitor Cst may supplement a voltage charged in liquid crystal capacitor Clc.

Figure 4A:
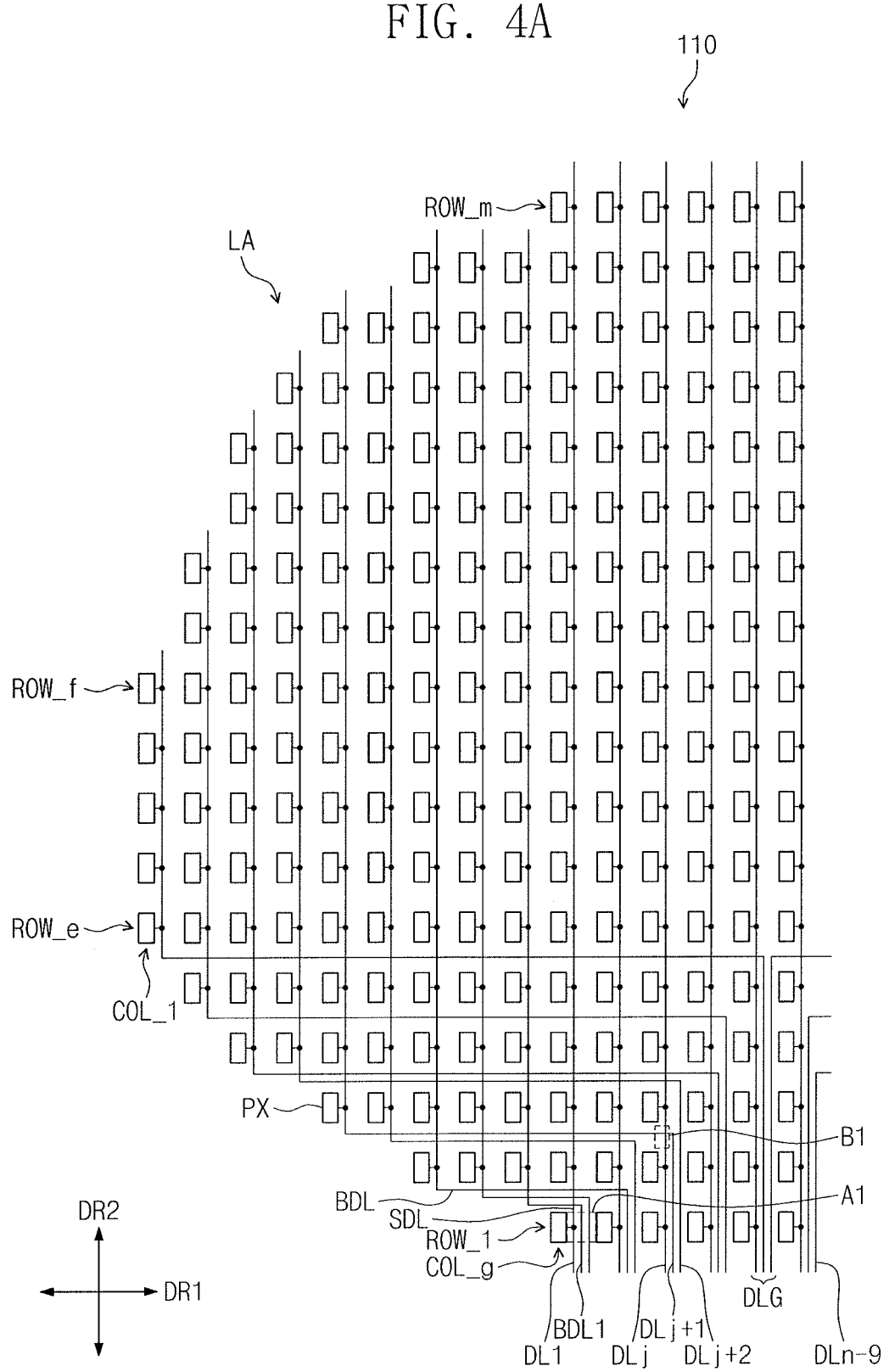
FIGS. 4A and 4B illustrate an embodiment of a connection between data lines and pixels.
Figure 4B:
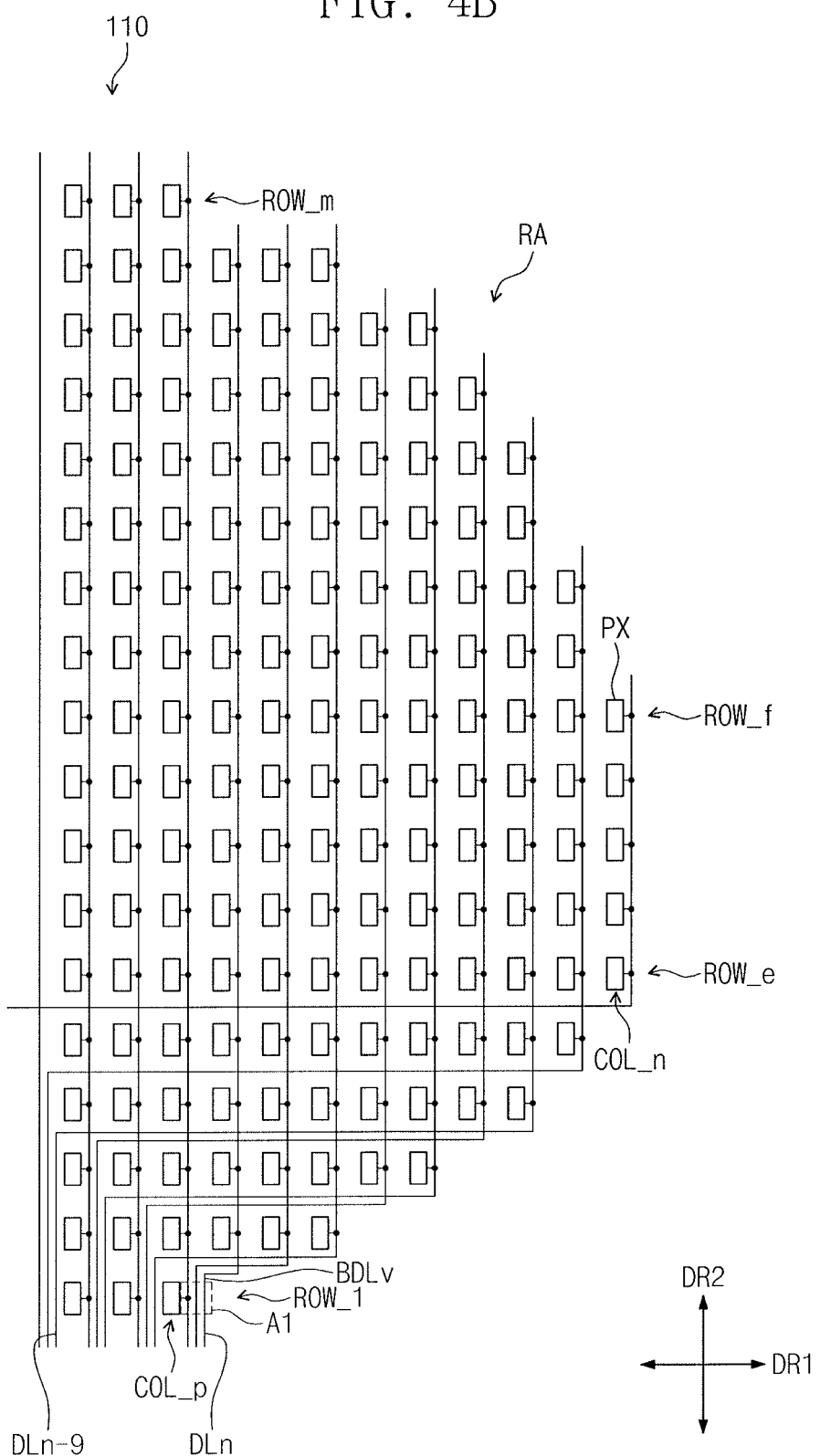

FIGS. 4A and 4B illustrate an embodiment of a connection between the data lines and pixels, for example, corresponding to the display panel of FIG. 1. FIG. 4A illustrates pixels PX on a central portion and a left area LA of the display panel 110. FIG. 4B illustrates pixels PX on a right area RA of the display panel 110.

Referring to FIGS. 4A and 4B, the pixels PX are arranged in a plurality of rows ROW_1 to ROW_m and a plurality of columns COL_1 to COL_n. The rows ROW_1 to ROW_m extend in the first direction DR1. The columns COL_1 to COL_n extend in the second direction DR2. In FIGS. 4A and 4B, the number of rows ROW_1 to ROW_m gradually increases upward. The number of columns COL_1 to COL_n gradually increases in a right direction.

The pixels PX may include a plurality of red pixels to emit red light, a plurality of green pixels to emit green light, and a plurality of blue pixels to emit blue light. In one embodiment, the pixels PX may include a plurality of white pixels, a plurality of yellow pixels, a plurality of cyan pixels, and a plurality of magenta pixels. The pixels PX may be arranged in the order of red, green, and blue pixels in each of the rows ROW_1 to ROW_m, or in a different order in another embodiment.

A number K pixels PX may be in an a-th row of the rows ROW_1 to ROW_m, where a and k are natural numbers. or example, when a is 1, k pixels PX may be in a first row ROW_1 as illustrated in FIGS. 4A and 4B. In another embodiment, the a-th row may be between the first row ROW_1 and an m-th row ROW_m that is the last row. The first row ROW_1 of the rows ROW_1 to ROW_m may be adjacent to the data driver 130. The k pixels PX in the first row ROW_1 may be in a g-th column COL_g to a p-th column COL_p between a first column COL_1 and an n-th column COL_n that is the last column. The values g and p are natural numbers, where g is greater than 1, p is greater than g, and n is greater than p.

Referring to FIGS. 4A and 4B, k pixels PX having the same number as the pixels PX in the first row ROW_1 may be in the m-th row ROW_m. In one embodiment, pixels PX of a number greater than pixels PX in the first row ROW_1 may be in the m-th row ROW_m.

The k pixels PX in the first row ROW_1 may be a reduced or minimum number of pixels in the rows ROW_1 to ROW_m. In FIGS. 4A and 4B, k=9 but k may be a different number in the first row ROW_1 in another embodiment.

The number n pixels PX may be in each of an e-th row ROW_e to an f-th row ROW_f of the rows between the first row ROW_1 and the m-th row ROW_m. In one embodiment, the number n is greater than k, e and f are natural numbers, e is greater than 1, f is equal to or greater than e, and m is greater than f.

The n pixels PX in each of the e-th row ROW_e to the f-th row ROW_f may be a greater or maximum number of pixels PX of the pixels PX in the rows ROW_1 to ROW_m. In FIGS. 4A and 4B, n=27 but may be a different number in each of the e-th row ROW_e to the f-th row ROW_f in another embodiment. In one embodiment, pixels PX of a number greater than k and less than n may be in each of the remaining rows, except for the first row ROW_1, the m-th row ROW_m, and the e-th row ROW_e.

The number of pixels PX in a present row in the rows between the first row ROW_1 and the e-th row ROW_e may be equal to or greater than the number of pixels PX in a former row. In one embodiment, the number of pixels PX in a present row may be the same as the number of pixels PX in the former row.

The number of pixels PX in a present row in rows between the f-th row ROW_f and the m-th row ROW_m may be equal to or less than that of pixels PX in a former row. For example, the number of pixels PX disposed in an f+2-th row may be the same as that of pixels PX in an f+1-th row, and the number of pixels PX in an f+3-th row may be less than that of pixels PX disposed in the f+2-th row.

A number L data lines may be in each of first areas A1, which corresponds to an area between adjacent pixels PX in the first row ROW_1 and an area adjacent to one side of the pixel PX in one column of the first column and the last column of the first row ROW_1, where L is a natural number. For example, an area adjacent to a right side of the pixel PX in the p-th column COL_p, that is the last column of the first row ROW_1, may be or include the first area A1.

The number L may be a value based on dividing the maximum number of pixels PX of the pixels PX in the rows ROW_1 to ROW_m by the minimum number of pixels PX. For example, L may be a value based on dividing n by k. In this case, the number L corresponds to a share of the value obtained by dividing n by k. If a remaining value does not exist when n is divided by k, L data lines may be in each of the first areas A1.

However, if a remaining value exists when n is divided by k, other or remaining data lines may be additionally in the first areas A1.

The data lines DL1 to DLn may include a plurality of data line groups DLG which respectively include L data lines. For example, as illustrated in FIGS. 4A and 4B, when n=27 and k=9, L may be determined as 3. Thus, 3 data lines may be in each of the first areas A.

The data lines DL1 to DLn extend in the second direction DR2 in the first areas A1. The data lines DL1 to DLn in the first areas A1 extend to the data driver 130 in the second direction DR2 and are connected to the data driver 130.

The data line groups DLG include a plurality of straight lines SDL and a plurality of bent data lines BDL. The straight lines SDL may be first data lines of the L data lines of each of the data line groups DLG. The bent data lines BDL may be data lines except for the straight lines SDL.

The straight data lines SDL may extend in the second direction DR2 and be connected to the pixels PX in the corresponding column of the g-th column COL_g to the p-th column COL_p. In the first row ROW_1 to the e-th row ROW_e, the bent data lines BDL may be bent twice to extend in the second direction DR2, the first direction DR1, and the second direction DR2. The bent data lines BDL extend from the e-th row ROW_2 in the second direction DR2.

The bent data lines BDL may extend to be bilaterally symmetrical to each other with respect to a predetermined area of a central portion of the display panel 110. The bent data lines BDL may include first to v-th bent data lines BDL1 to BDLv and be connected to the pixels PX that are not connected to the straight data lines SDL.

An area of the display panel 110, which is disposed at a left side with respect to the central portion of the display panel 110 in the first direction DR1, may corresponding to a left area LA of the display panel 110. An area of the display panel 110, which is disposed at a right side with respect to the central portion of the display panel 110 in the direction DR1, may correspond to a right area RA of the display panel 110.

An embodiment of the left area LA of the display panel 110 is in FIG. 4A, and an embodiment of the right area RA of the display panel 110 is in FIG. 4B. The pixels PX in the central portion of the display panel 110 may be arranged in the form of the matrix and may be pixels PX in a g+3-th column to a g+5-th column.

In the first row ROW_1 to the e-th row ROW_e, the number of pixels PX in an h-th row may be different from the number of pixels PX in an h+1-th row, where h is a natural number. In this case, the bent data lines BDL having the same number as a difference between the number of pixels PX in the h-th row and the number of pixels PX in the h+1-th row may extend in the first direction DR1 between the pixels PX in the h-th row and the pixels PX in the h+1-th row.

The bent data lines BDL bent from the second direction DR2 to the first direction DR1 to extend may be bent from the first direction DR1 to the second direction DR2 to extend. Each of the bent data lines BDL extending from the first direction DR1 to the second direction DR2 may be connected to the pixels PX in the corresponding column of the columns COL_1 to COL_n.

The bent data lines BDL in first areas A1 successively extend from the second direction DR2 to the first direction DR1, while increasing in order of the bent data lines BDL from the first bent data line BDL1. Also, the bent data lines BDL in the first areas A1 successively extend from the second direction DR2 to the first direction DR1, while decreasing in order of the bent data lines BDL from a v-th bent data line BDLv.

When the number of pixels PX in the h+1-th row is greater, by c, than the number of pixels PX in the h-th row in the left area LA of the display panel 110 and the first row ROW_1 to the e-th row ROW_e, c bent data lines BDL may extend between the pixels PX in the h-th row and the pixels PX in the h+1-th row in the first direction DR1 in the left area LA of the display panel 110 and the first row ROW_1 to the e-th row ROW_e, where c is a natural number.

When the number of pixels PX in the h+1-th row is greater, by d, than the number of pixels PX in the h-th row in the right area RA of the display panel 110 and the first row ROW_1 to the e-th row ROW_e, d bent data lines BDL may extend between the pixels PX in the h-th row and the pixels PX in the h+1-th row in the first direction DR1 in the right area RA of the display panel 110 and the first row ROW_1 to the e-th row ROW_e, where d is a natural number.

For example, the number of pixels PX in the first row ROW_may be 9 and the number of pixels PX in the second row may be 15. A difference value between the number of pixels PX in the first row ROW_1 and the number of pixels PX in the second row is 6. Thus, 6 bent data lines BDL may extend in the first direction DR1 between the pixels PX in the first row ROW_1 and the pixels PX in the second row.

Since the pixels are bilaterally symmetrical to each other in FIGS. 4A and 4B, c and d may have the same value, e.g., a value of 3. In one embodiment, when the pixels PX are not bilaterally symmetrical to each other, c and d may have different values.

When c and d have the same value (e.g., 3), three bent data lines BDL may successively be bent to extend from the second direction DR2 to the first direction DR1, while increasing in order of the bent data lines BDL from the first bent data line BDL1. Also, three bent data lines BDL may successively be bent to extend from the second direction DR2 to the first direction DR1, while decreasing in order of the bent data lines BDL from the v-th data line BDLv.

In the left area LA of the display panel 110, a first bent data line BDL1, a second bent data line, and a third bent data line of the bent data lines BDL in the first area A1 to extend in the second direction DR2 are successively bent to extend in the first direction DR1 between the pixels PX in the first row ROW_1 and the pixels PX disposed in the second row.

In the right area RA of the display panel 110, a v-th bent data line BDL1, a v-1-th bent data line, and a v-2-th bent data line of the bent data lines BDL in the first area A1 to extend in the second direction DR2 are successively bent to extend in the first direction DR1 between the pixels PX disposed in the first row ROW_1 and the pixels PX disposed in the second row.

Since the number of pixels PX in the second row is 15 and the number of pixels PX in a third row is 19, a difference value between the number of pixels PX in the second row and the number of pixels PX in the third row is 4. In the left area LA and the right area RA of the display panel 110, fourth and fifth bent data lines and v-3-th and v-4-th bent data lines may successively be bent to extend in the first direction DR1 between the pixels PX in the second row and the pixels PX in the third row.

The bent data lines BDL may be bent to extend from the second direction DR2 to the first direction DR1 in the first row ROW_1 to the e-th row ROW_e through the foregoing manner. The bent data lines BDL extending in the first direction DR1 are successively bent to extend from the first direction DR1 to the second direction DR2 from the first bent data line BDL1 and the v-th bent data line BDLv.

Each of the bent data lines BDL bent to extend from the first direction DR1 to the second direction DR2 is connected to the pixels PX in the corresponding column of a first column COL_1 to a g-1-th column and a p+1th column to n-th column COL_n. The bent data lines BDL bent to extend from the first direction DR1 to the second direction DR2 are connected by a column unit to the pixels PX successively disposed in an e-1-th column to the first column COL_1 from the first bent data line BDL1 and connected by a column unit to the pixels PX successively disposed in a p+1-th column to n-th column COL_n from the v-th bent data line BDLv.

For example, in the left area LA of the display panel 110, the first, second, and third bent data lines extending in the first direction DR1 between the pixels PX arranged in the first row ROW_1 and the pixels PX in the second row are successively bent to extend from the first direction DR1 to the second direction DR2. In the left area LA and the right area RA of the display panel 110, the first, the second, and the third bent data lines extending from the first direction DR1 to the second direction DR2 are successively connected by a column unit to the pixels PX in an e-1-th to e-3-th columns.

The first bent data line BDL1 extends from the first direction DR1 to the second direction DR2 and is connected to the pixels PX arranged in the corresponding e-1-th column of the first column COL_1 to the e-1-th column. The second bent data line extends from the first direction DR1 to the second direction DR2 and is connected to the pixels PX arranged in the corresponding e-2-th column of the first column COL_1 to the e-1-th column. The third bent data line extends from the first direction DR1 to the second direction DR2 and is connected to the pixels PX arranged in the corresponding e-3-th column of the first column COL_1 to the e-1-th column.

In the right area LA of the display panel 110, the v-th, the v-1-th, and the v-2-th bent data lines BDL may extend in the same manner and are successively connected by the column unit to the pixels PX in a p+1-th, a p+2-th, and a p+3-th columns. Other or remaining ones of the bent data lines BDL may be connected to other or remaining ones of the pixels in the same manner.

For example, the bent data lines BDL may successively extend in the second direction DR2, the first direction DR1, and the second direction DR2 from the first bent data line BDL1 and the v-th bent data line BDLv. In one embodiment, the bent data lines BDL may extend in the second direction DR2, the first direction DR1, and the second direction DR2.

Figure 5:
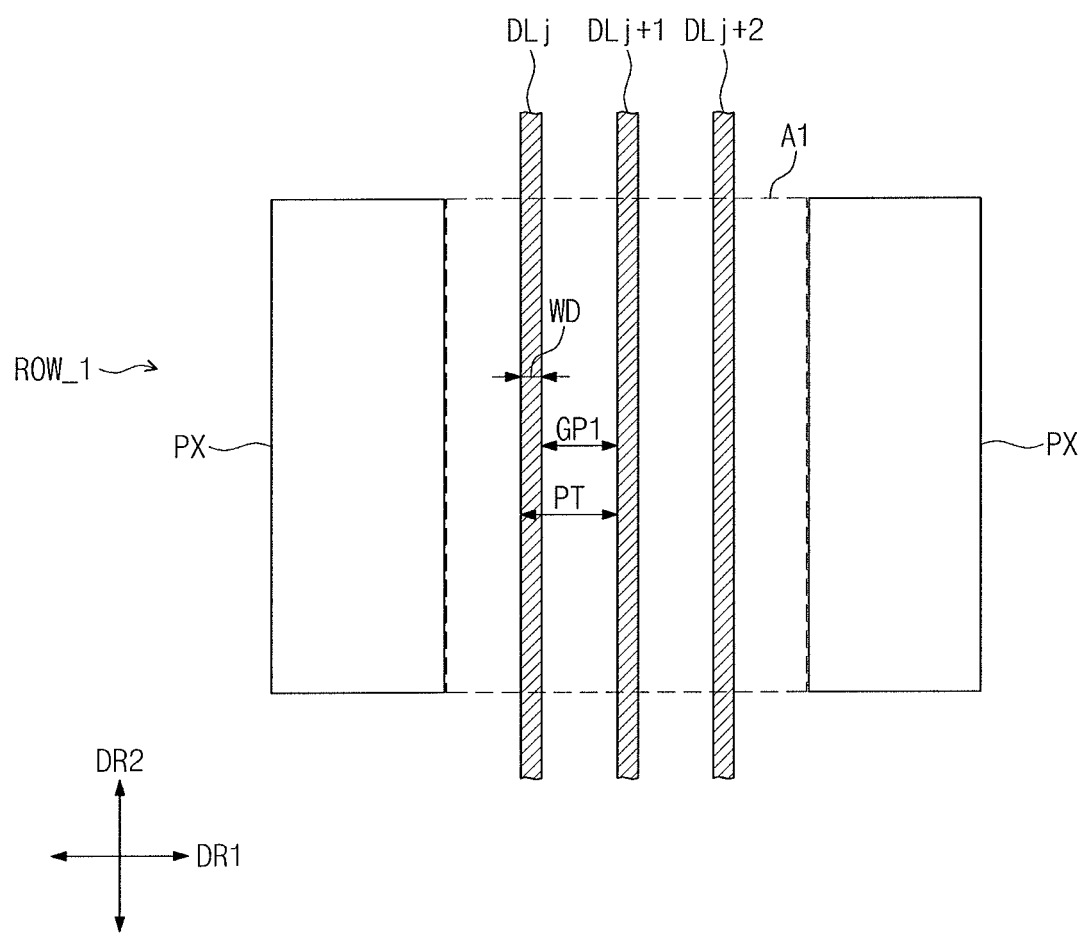
FIG. 5 illustrates an embodiment of L data lines in one first area.
Figure 6:
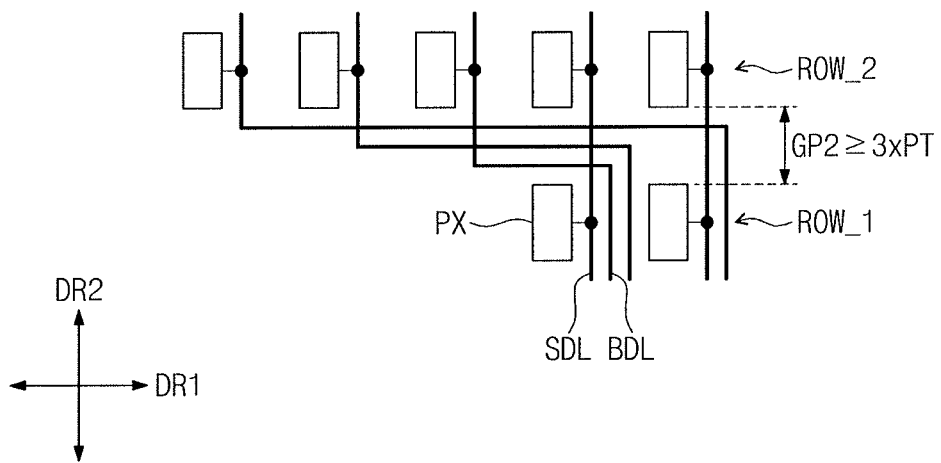
FIGS. 6 to 8 illustrate an embodiment of a distance between pixels in rows.
Figure 7:
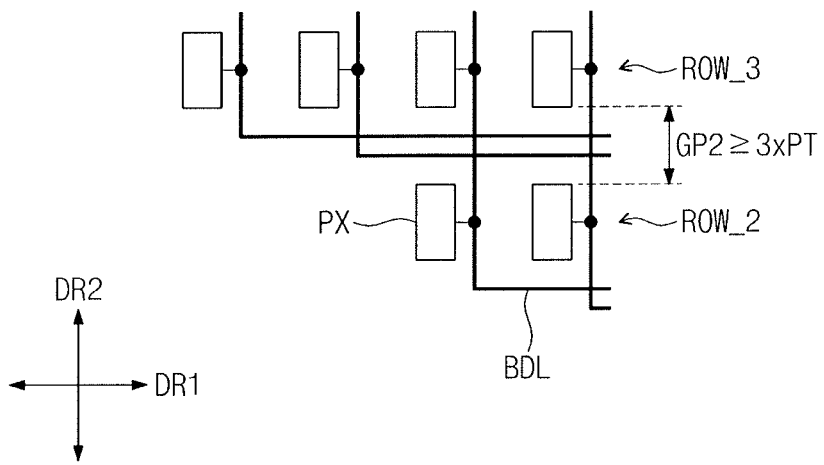
Figure 8:
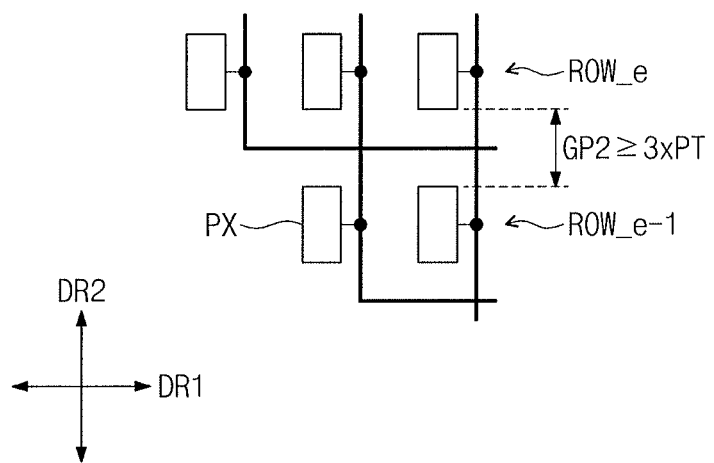

FIG. 5 illustrates an embodiment of L data lines in one first area of FIG. 4A. FIGS. 6 to 8 are views illustrating an example of a distance between pixels in adjacent rows in FIGS. 4A and 4B. Each of FIGS. 6 to 8 illustrates an example of pixels in two rows in the left area LA of the display panel 110 and in the first row ROW_1 to the e-th row ROW_e.

Referring to FIG. 5, L data lines DLj, DLj+1, and DLj+2 in the first area A1 of the first row ROW_1 extend in the second direction DR2 and are at the same distance in the first direction DR1. The data lines adjacent to each other of the data lines DLj, DLj+1, and DLj+2 may be spaced a first distance GP1 from each other in the first direction DR1 in the first area A1.

Each of the data lines DLj, DLj+1, and DLj+2 has a predetermined width WD in the first direction DR1. The distance of sides of the data lines adjacent to each other of the L data lines DLj, DLj+1, and DLj+2 in the first direction corresponds to a pitch PT. The pitch PT may be based on a sum of the first distance GP1 and the width WD.

Referring to FIGS. 6 to 8, the pixels PX have the same size. The pixels PX in an h-th row and the pixels PX in an h+1-th row are arranged in the first direction DR1. The distance between the pixels PX in adjacent rows in the second direction DR2 on the display panel 110 may correspond to a second distance GP2.

The second distance GP2 may be equal to or greater than the product of the pitch PT and the maximum value of a difference value in number of pixels PX in the rows adjacent to each other on the left area LA and in the first row ROW_1 to the e-th row ROW_e or a difference value in number of pixels PX disposed in the rows adjacent to each other on the right area RA and in the first row ROW_1 to the e-th row ROW_e.

As described with reference to FIGS. 4A and 4B, when the pixels PX are bilaterally symmetrical to each other, c and d may have the same value. In the left area LA of the display panel 110 and the first row ROW_1 to the e-th row ROW_e, a difference value in the number of pixels PX in rows adjacent to each other may be 1 to 3. In the right area RA of the display panel 110 and the first row ROW_1 to the e-th row ROW_e, a difference value in the number of pixels PX in rows adjacent to each other may be 1 to 3.

The maximum value of the difference value in number of pixels PX in the rows adjacent to each other on the left area LA of the display panel 110 and in the first row ROW_1 to the e-th row ROW_e and the difference value in number of pixels PX in the rows adjacent to each other on the right area RA of the display panel 110 and in the first row ROW_1 to the e-th row ROW_e is 3. Thus, the second distance GP2 may be equal to or greater than the product of the pitch PT and the value of 3.

When h=1, as illustrated in FIG. 6, the second distance GP2 between the pixels PX in the first row ROW_1 and the pixels PX in the second row ROW_2 may be equal to or greater than the product of the pitch PT and the value of 3, e.g., GP2≥PT×3. When h=2, as illustrated in FIG. 7, the second distance GP2 between the pixels PX in the second row ROW_2 and the pixels PX in the third row ROW_3 may be equal to or greater than the product of the pitch PT and the value 3.

When h is e−1, as illustrated in FIG. 8, the second distance GP2 between the pixels PX in an e−1-th row ROW_e−1 and the pixels PX in an e-th row ROW_e may be equal to or greater than the product of the pitch PT and the value 3. The second distance GP2 between pixels PX in adjacent rows and other or remaining rows may also be equal to or greater than that obtained by multiplying the pitch PT by 3.

The pixels PX may not be disposed bilaterally symmetrical to each other. For example, in the left area LA of the display panel 110 and the first to e-th rows ROW_1 to ROW_e, a difference value in number of pixels PX in adjacent rows may be 1 to 4. In the right area RA of the display panel 110 and the first to e-th rows ROW_1 to ROW_e, a difference value in number of pixels PX in adjacent rows may be 1 to 3. In this case, the second distance GP2 may be equal to or greater than the product of the pitch PT and the value 4.

When an L number of data lines DL1 to DLn are not between the pixels PX of the first row ROW_1, but are disposed one-by-one between the pixels PX of the first row ROW_1, the data lines not between the pixels PX may extend via the non-display area NDA on which the pixels PX are not disposed. Since the space of the non-display area NDA, in which the data lines that are not disposed between the pixels PX that are disposed, is to be secured, the bezel area of the non-display area may increase.

In an embodiment, L number of data lines DL1 to DLn are between the pixels PX of the first row ROW_1. As a result, the bezel area may be reduced. Thus, the display apparatus 100 may realize a narrow bezel.

Figure 9:
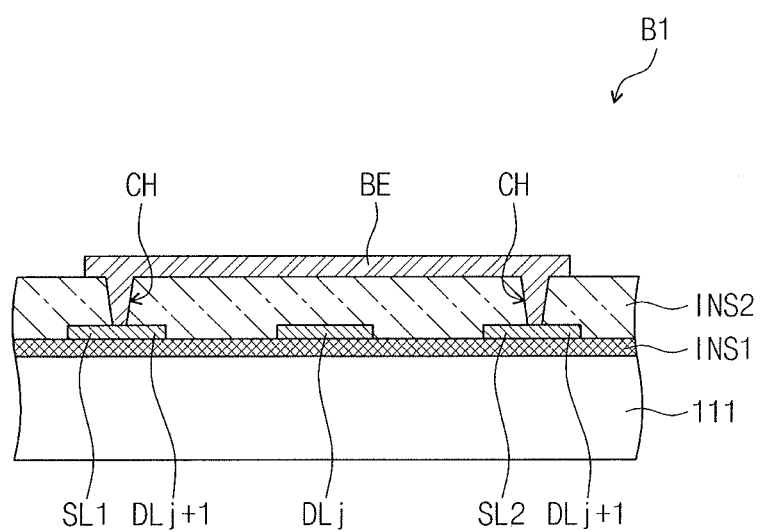
FIG. 9 illustrates a view of an area B1 in FIG. 4A.

FIG. 9 illustrates a cross-sectional view of an area B1 of FIG. 4A according to one embodiment. Referring to FIG. 9, one data line extending in the second direction DR2 may cross at least one data line extending in the first direction DR1. The data lines that extend in the first and second directions DR1 and DR2 and cross may be insulated from each other. For example, a j-th data line DLj extending in the second direction DR2 may cross a j+1-th data line DLj+1 extending in the first direction DR1. The j+1-th data line DLj+1 of the j-th data line DLj and the j+1-th data line DLj+1, which cross each other, may include a bridge electrode BE, a first sub line SL1, and a second sub line SL2.

A first insulation layer INS1 is on the first substrate 111, and the j-th and j+1-th data lines DLj and DLj+1 are on the first insulation layer INS1. The first sub line SL1 and the second sub line SL2 of the j+1-th data line DLj+1 are disposed with the j-th data line DLj therebetween. A second insulation layer INS2 is on the first insulation layer INS1 and covers the j-th and j+1-th data lines DLj and DLj+1.

The bridge electrode BE of the j+1-th data line DLj+1 is on the second insulation layer INS2. The bridge electrode BE and the data line DLj may be disposed with the second insulation layer INS2 therebetween. The bridge electrode BE passes through the second insulation layer INS2 and is connected to the first and second sub lines SL1 and SL3 through contact holes CH, which expose predetermined areas of the first and second sub lines SL1 and SL2.

Since the first sub line SL1 and the second sub line SL3 are electrically connected to each other through the bridge electrode BE, the j-th data line DLj extending in the second direction DR2 and the j+1-th data line DLj+1 extending in the first direction DR1 are insulated from each other, even though they cross.

Figure 10A:
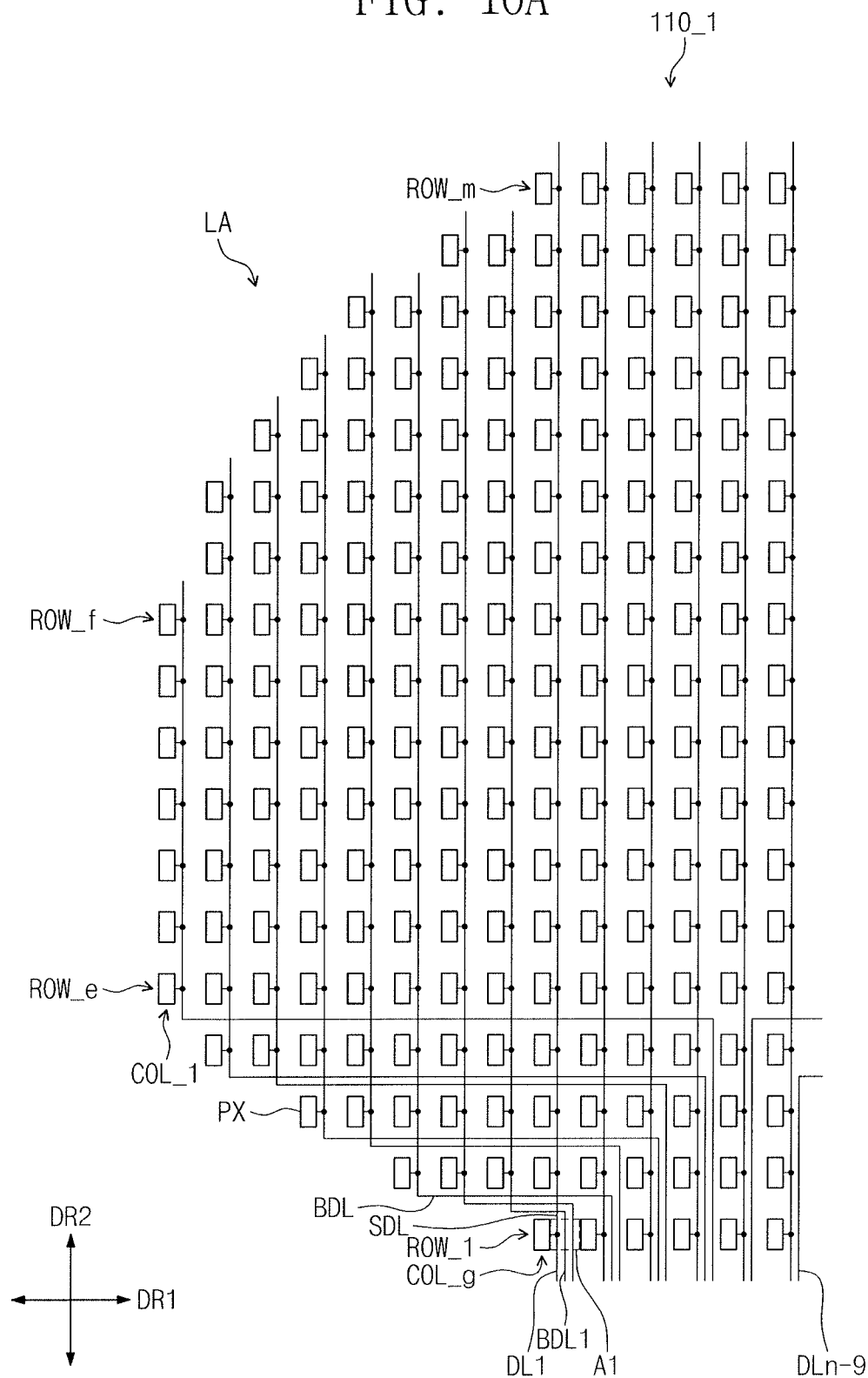
FIGS. 10A and 10B illustrate another embodiment of a connection between data lines and pixels.
Figure 10B:
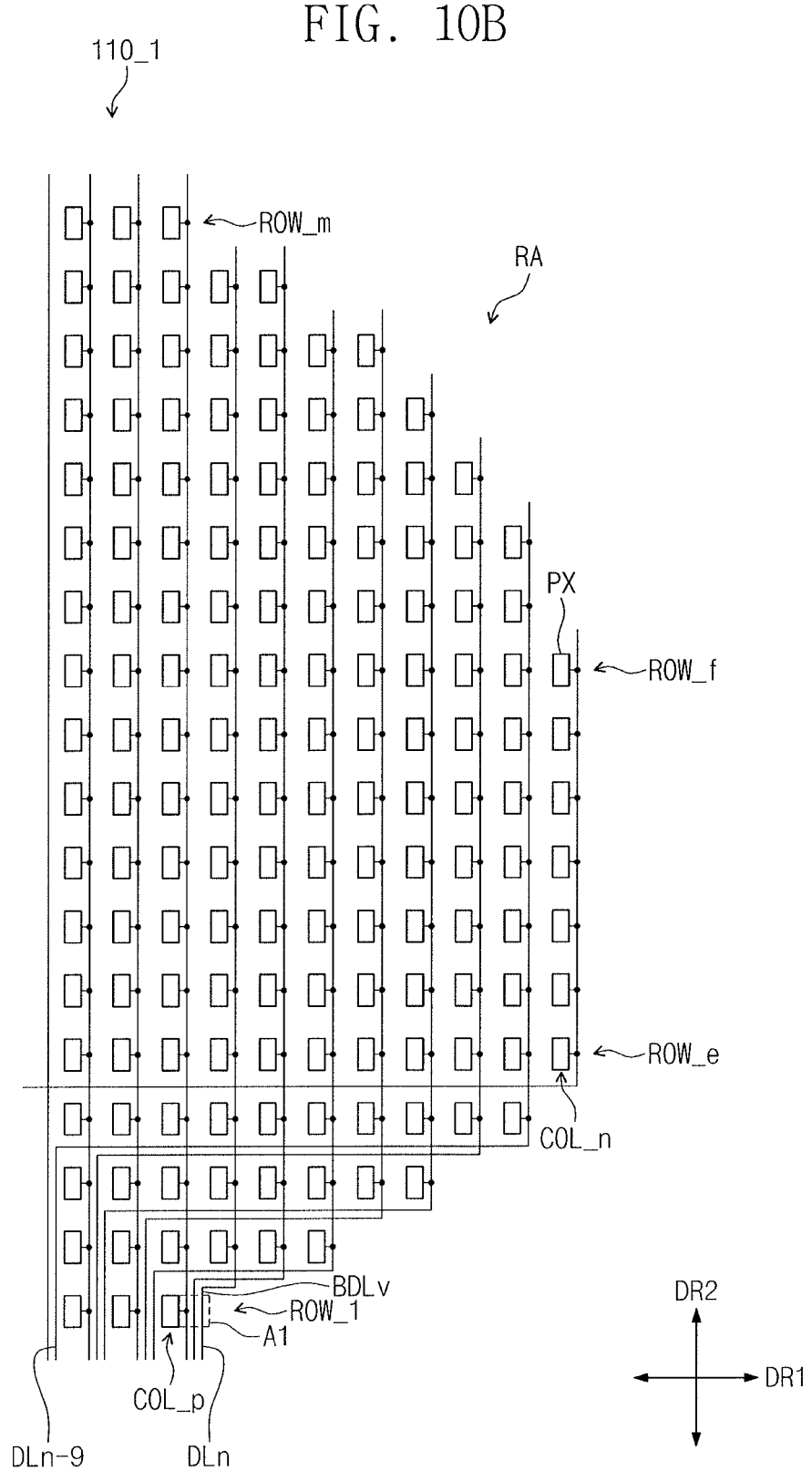

FIGS. 10A and 10B illustrate an embodiment of a connection between data lines and pixels of a display panel. Difference points for the connection between the data lines DL1 to DLn and the pixels PX in FIGS. 4A and 4B and for the connection between data lines DL1 to DLn and pixels PX will be described. For example, FIG. 10A illustrates pixels PX in a central portion and a left area LA of a display panel 110_1. FIG. 10B illustrates pixels PX in a right area RA of the display panel 110_1.

Referring to FIGS. 10A and 10B, the pixels PX are arranged in rows ROW_1 to ROW_m and columns COL_1 to COL_n. Each of the pixels PX in each of the row ROW_1 to ROW_m is connected to a corresponding data line of the data lines DL1 to DLn. The number of pixels PX in each of the first row ROW_1 to an m-th row ROW_m is k. The number of pixels in each of an e-th row ROW_e to an f-th row ROW_f is n. The number of pixels PX in each of other or remaining rows may be less than n and greater than k. In the examples of FIGS. 10A and 10B, k=9 and n=25.

The number of pixels PX in the present row in the rows between the first row ROW_1 and the e-th row ROW_e may be equal to or greater than the number of pixels PX in a former row. The number of pixels PX in the present row in the rows between the f-th row ROW_f and the m-th row ROW_m may be equal to or less than the number of pixels PX in a former row.

A number L data lines corresponding to a value obtained by dividing n by k may be in first areas A1, respectively. A remaining value may be obtained from dividing n by k, e.g., dividing n by k is b, where b data lines may be additionally disposed one-by-one in b first areas A1, where b is a natural number.

A number L+1 data lines may be in each of the b first areas A1 of the first areas A1, and the L data lines may be in each of the other or remaining first areas A1. The number L+1 data lines are successively disposed in w first areas A1 from the most left side of the first areas A1 and successively disposed in b-w first area A1 from the most right side, where w is an integer equal to or greater than 0 and is equal to or less than b.

For example, in the examples of FIGS. 10A and 10B, since n=25 and k=9, a value obtained by n by k is 2 and the remaining value is 7. Thus, L is 2 and b is 7. Also, two data lines are in each of the first areas A1. When w is 4, 4 data lines of 7 data lines are successively disposed, one-by-one, in 4 first areas A1 from the most left side of the first areas A1. Other or the remaining 3 data lines of 7 data lines may be successively disposed, one-by-one, on 3 first areas A1 from the most right side of the first areas A1.

An extending manner of the data lines DL1 to DLn and a distance between the pixels in an h-th row and the pixels in an h+1-th row may be substantially the same as those, for example, described with reference to FIGS. 4A, 4B, and 5 to 8.

For example, as illustrated in FIGS. 4A and 4B, straight data lines SDL in the first areas A1 may extend in the second direction DR2 and be connected to the pixels in a corresponding column of column COL_1 to COL_n. Bent data lines BDL may extend in the second direction DR2, the first direction DR1, and the second direction DR2 and be connected to the pixels in a corresponding column of the column COL_1 to COL_n.

As illustrated in FIGS. 6 to 8, a second distance GP2 between the pixels PX in rows adjacent to each other in the second direction DR2 on the display panel 110_1 may be equal to or greater than that obtained by multiplying the pitch PT by the maximum value of a difference value in number of pixels PX in the rows adjacent to each other on a left area LA of the display panel 110_1 and in the first row ROW_1 to the e-th row ROW_e or a difference value in number of pixels PX in the rows adjacent to each other on a right area RA of the display panel 110_1 and in the first row ROW_1 to the e-th row ROW_e.

In the display apparatus including the display panel 110_1 of FIGS. 10A and 10B, since L or L+1 data lines may be between the pixels PX of the first row ROW_1, a bezel area may be reduced.

Figure 11:
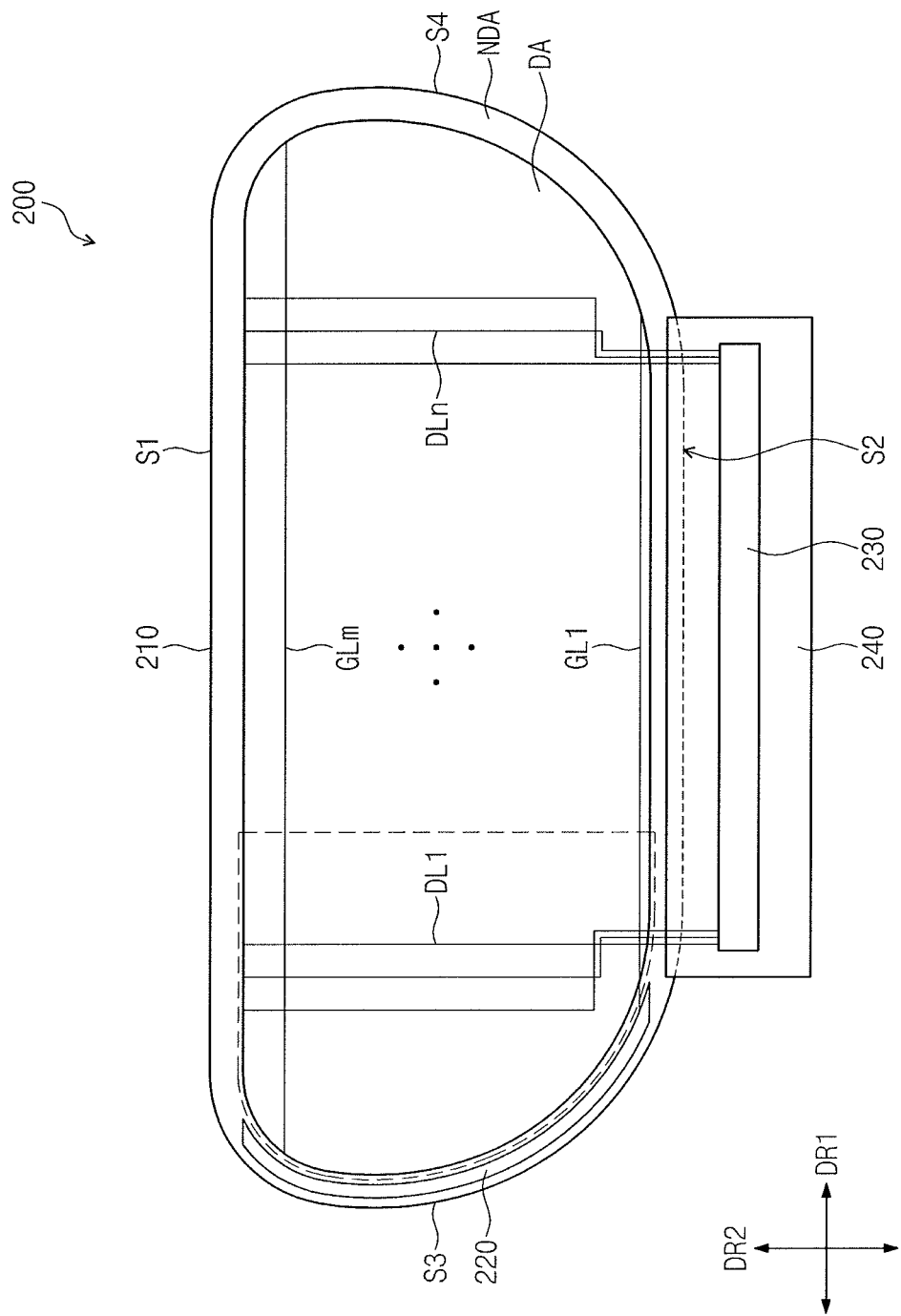
FIG. 11 illustrates another embodiment of a display apparatus.
Figure 12:
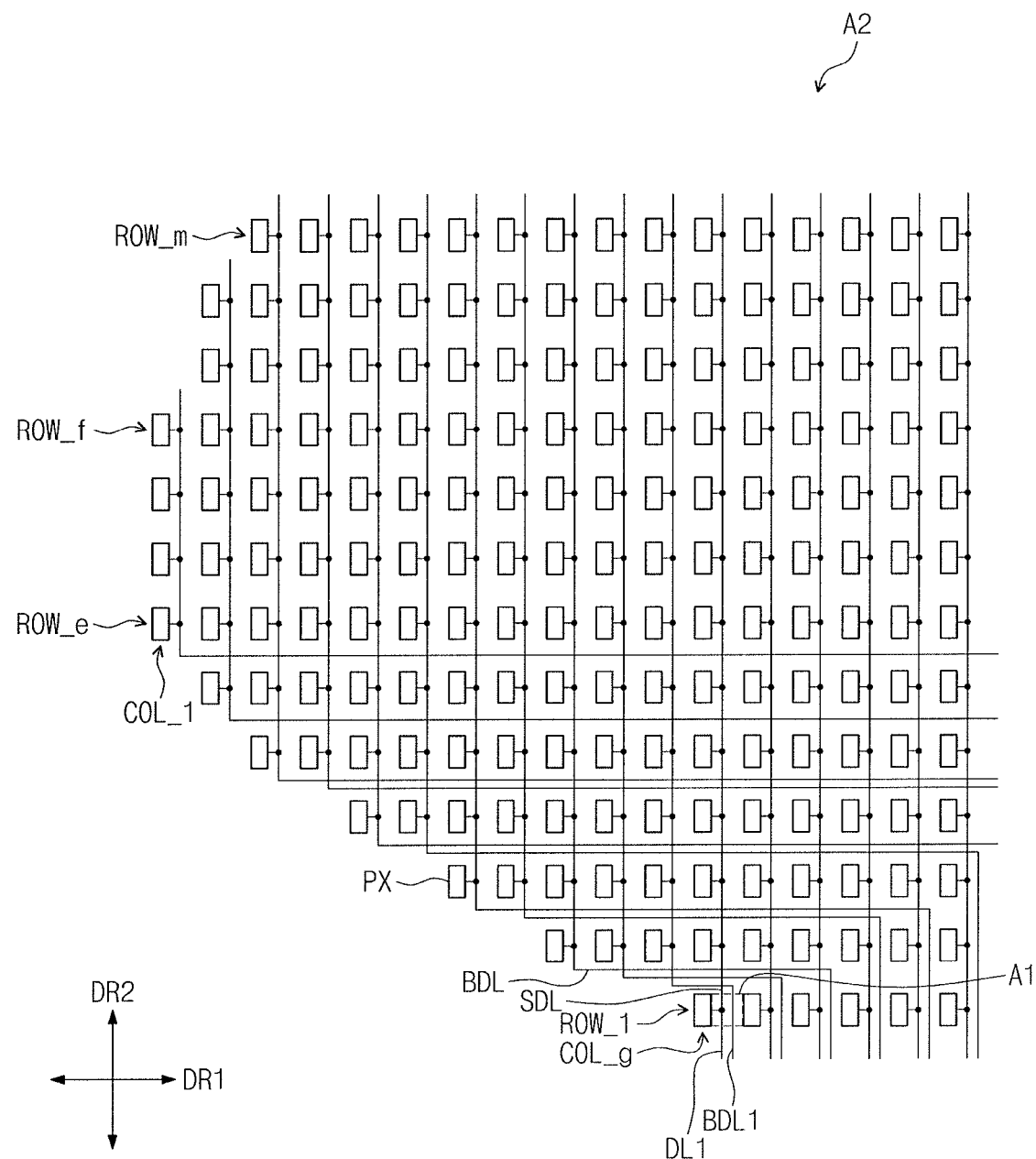
FIG. 12 illustrates another embodiment of pixels and data lines.

FIG. 11 illustrates another embodiment of a display apparatus 200, and FIG. 12 illustrates an embodiment of pixels and data lines in an area A2 of the display panel of FIG. 11. For example, FIG. 12 illustrates pixels PX and data lines, which are in the left area of a display panel 210 in a left side with respect to a central area of the display panel 210. The display panel 210 may have a structure that is bilaterally symmetrical, e.g., pixels PX and data lines in a right area of the display panel 210 may be symmetrical to those in the left area of the display panel 210. Pixels PX in a central area of the display panel 210 may be arranged in the form of a matrix.

Referring to FIGS. 11 and 12, the display apparatus 200 includes the display panel 210, a gate driver 220, a data driver 230, and a flexible circuit board 240. The display panel 210 includes a plurality of pixels PX, a plurality of gate lines GL1 to GLm connected to the pixels PX, and a plurality of data lines DL1 to DLn.

The gate lines GL1 to GLm extend in a first direction DR1 and are connected to the gate driver 220 in an non-display areas NDA at a left side of the display panel 210. The data lines DL1 to DLn are connected to the data driver 230. The data driver 230 is mounted on the flexible circuit board 240 and connected to the non-display area NDA at a lower end of the display panel 210.

The display apparatus 200 may have the same constituent elements as the display apparatus 100 of FIG. 1, except for the shape of the display panel 210 and an arrangement of the pixels PX according to the shape of the display panel 210.

The display panel 210 may have a shape similar to that of a rearview mirror of a vehicle. The display panel 210 includes a first side S1 extending in the first direction DR1, a second side S2 extending in the first direction DR1 facing the first side S1 and having a length less than the first side S1, a third side S3 connecting one side of the first side S1 to one side of the second side S2, and a fourth side S4 connecting the other side of the first side S1 to the other side of the second side S2. Each of a predetermined area of each of both sides of the third side S3 and a predetermined area of each of both sides of the fourth side S4 has a curved shape that protrudes to the outside.

The display panel 210 includes a display area DA and a non-display area NDA surrounding the display area DA. The pixels PX may be arranged in a plurality of rows and plurality of columns in the display area DA. An a-th row may be a first row ROW_1, and k pixels PX may be in the first row ROW_1. A number n pixels PX may be in each of an e-th row ROW_e to an f-th row ROW_f of the rows between the first row ROW_1 and an m-th row ROW_m.

A number r pixels PX number greater than the number k may be in the m-th row ROW_m, where r is a natural number that is greater than k and less than n. The pixel PX having number greater than k and less than n may be in each of rows between the first row ROW_1 and an e-th row ROW_e. A number of pixels PX less than n and greater than r may be in each of rows between an f-th row ROW_f and the m-th row ROW_m.

The number of pixels PX in a present row, in the rows between the first row ROW_1 and the e-th row ROW_e, may be equal to or greater than the number of pixels PX in a former row. The number of pixels PX in a present row, in the rows between the f-th row ROW_f and the m-th row ROW_m, may be equal to or less than the number of pixels PX in a former row.

The arrangement of the data lines DL1 to DLn, the extending manner of the data lines DL1 to DLn, and the distance between the pixels PX in an h-th row and the pixels PX in an h+1-th row may be substantially the same as in FIGS. 4A, 4B, 5 to 8, 10A, and 10B, except for a shape of the display panel 210.

For example, like the arrangement of data lines DL1 to DLn in FIGS. 4A and 4B, L data lines corresponding to a value obtained by dividing n by k may be in each of the first areas A1 of the first row ROW_1. However, when a remaining value obtained by dividing n by k exists, like the arrangement of data lines DL1 to DLn in FIGS. 10A and 10B, b data lines corresponding to the remaining value may be additionally disposed, one-by-one, in each of the first areas A1.

Straight data lines SDL may extend in the second direction DR2 and be connected to pixels PX in a corresponding column of the columns. Bent data lines BDL may extend in the second direction DR2, the first direction DR1, and second direction DR2 and may be connected to pixels in a corresponding column of the columns.

As illustrated in FIGS. 6 to 9, a second distance GP2 between the pixels PX in the rows adjacent to each other in the second direction DR2 on the display panel 210 may be equal to or greater than that obtained by multiplying a pitch PT by the maximum value of a difference value in number of pixels PX in the rows adjacent to each other in a left area LA of the display panel 210 and in the first row ROW_1 to the e-th row ROW_e or a difference value in number of pixels PX disposed in the rows adjacent to each other on a right area RA of the display panel 210 and in the first row ROW_1 to the e-th row ROW_e.

In the display apparatus 200, L data lines are between the pixels PX of the first row ROW_1. As a result, the bezel area may be reduced.

Figure 13:
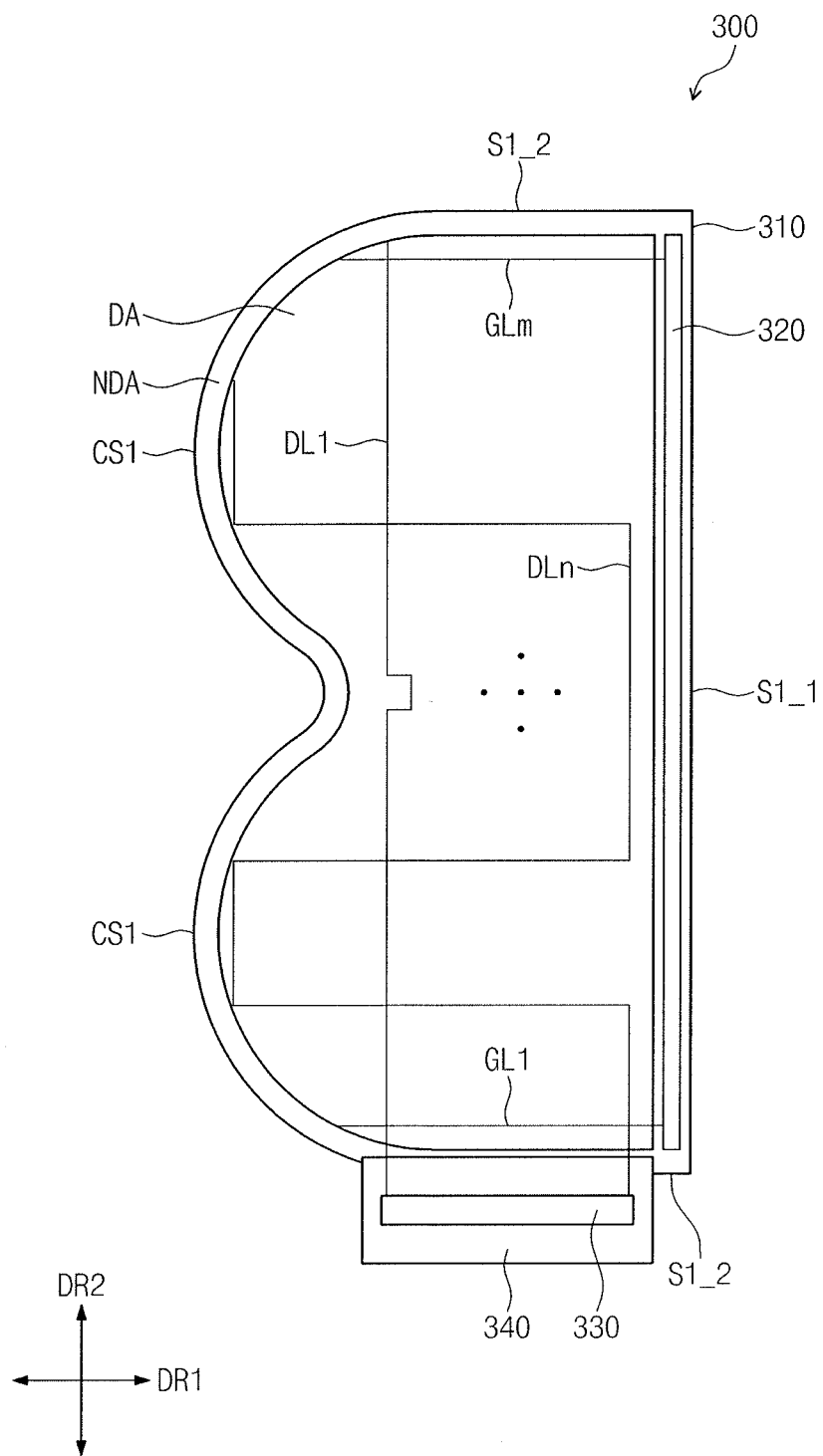
FIG. 13 illustrates another embodiment of a display apparatus.
Figure 14:
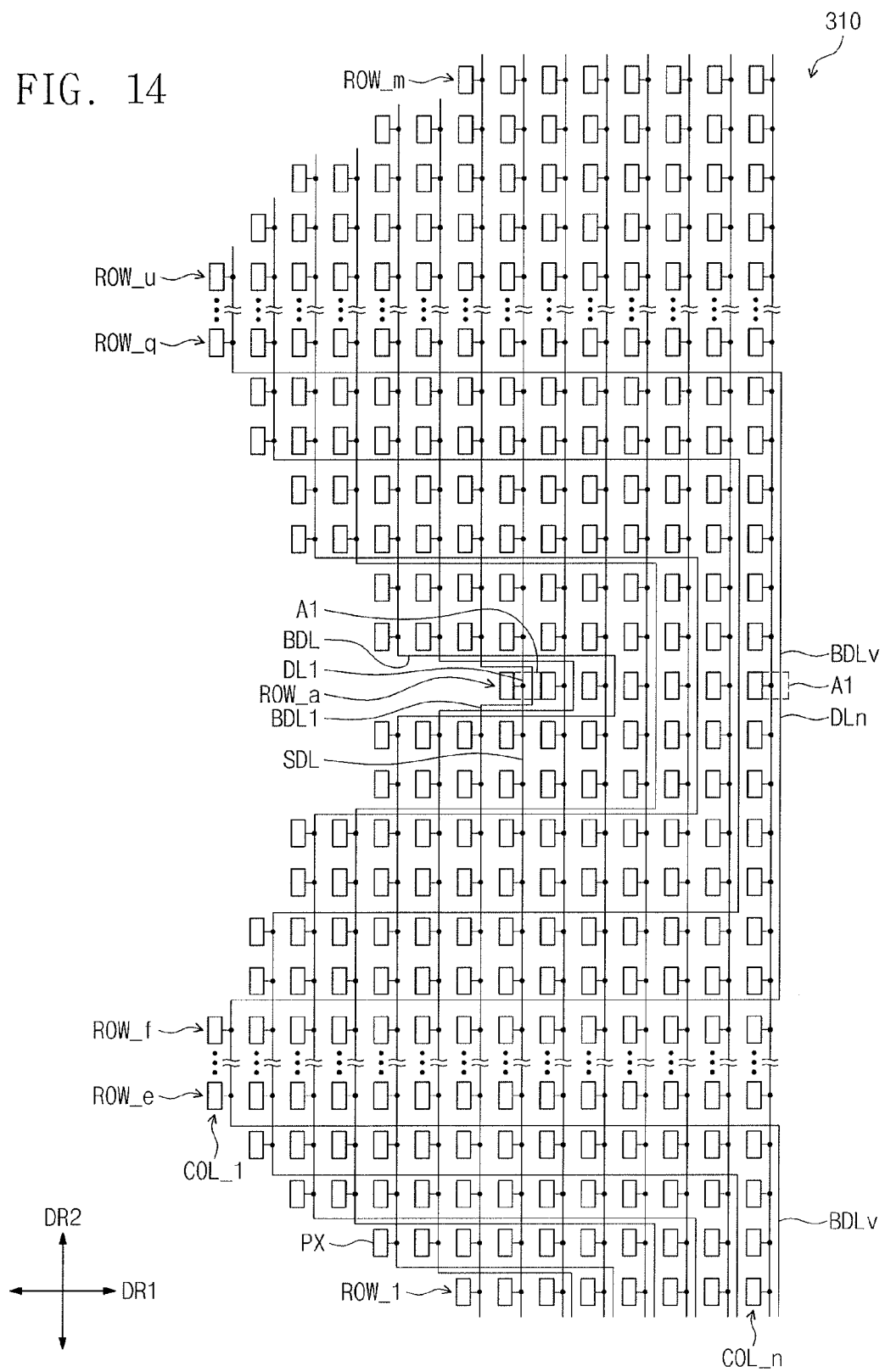
FIG. 14 illustrates another embodiment of pixels and data lines.

FIG. 13 illustrates another embodiment of a display apparatus 300, and FIG. 14 illustrates an embodiment of pixels and data lines in a display panel of FIG. 13. Referring to FIGS. 13 and 14, the display apparatus 300 includes a display panel 310, a gate driver 320, a data driver 330, and a flexible circuit board 340. The display panel 310 includes a plurality of pixels PX, a plurality of gate lines GL1 to GLm connected to the pixels PX, and a plurality of data lines DL1 to DLn.

The gate lines GL1 to GLm extend in a first direction DR1 and are connected to the gate driver 320 in an non-display areas NDA at a right side of the display panel 310. The data lines DL1 to DLn are connected to the data driver 330. The data driver 330 is mounted on the flexible circuit board 340 and connected to the non-display area NDA at a lower end of the display panel 310.

The display apparatus 300 may have the same constituent elements as the display apparatus 100 of FIG. 1, except for a shape of the display panel 310 and an arrangement of the pixels PX according to the shape of the display panel 310.

The display panel 310 may have a shape similar to that of goggles. For example, the display panel 310 includes a first side extending in the second direction DR2, two second sides S1_2 connected to different sides of the first side S1_1 to extend in the first direction DR1, and two curved sides CS1 facing the first side S1_1 and each of which has a curved shape. The curved sides CS1 have sides connected to each other. Each of the curved sides CS1 has one side connected to an end of a corresponding second side S1_2 of the second sides S1_2. Each of the curved sides CS1 has a curved shape that protrudes to the outside of the display panel 310.

The pixels PX may be arranged in a plurality of rows ROW_1 to ROW_m and a plurality of columns COL_1 to COL_n. An a-th row ROW_a may be a row between a first row ROW_1 and an m-th row ROW_m. A number k pixels PX may be in the a-th row ROW_a. A number n pixels PX may be in each of an e-th row ROW_e to an f-th row ROW_f of the rows between the first row ROW_1 and the a-th row ROW_a. A number n pixels PX may be in each of a q-th row ROW_q to an u-th row ROW_u of the rows between the a-th row ROW_a and the m-th row ROW_m. The numbers q an u are natural numbers, u is greater than q, and m is greater than u.

The number of pixels in the first row ROW_1 and the m-th row ROW_m may be r that is greater than k. The pixels PX having number that is greater than k and less than n may be in each of the rows between the a-th row ROW_a and the q-th row ROW_q and the rows between the a-th row ROW_a and the f-th row ROW_f. The pixels PX having number that is greater than r and less than n may be in each of the rows between the first row ROW_1 and the e-th row ROW_e and the rows between the u-th row ROW_u and the m-th row ROW_m. In FIGS. 14, k=7 and n=14.

The number of pixels PX in a present row, in the rows between the first row ROW_1 and the e-th row ROW_e, may be equal to or greater than the number of pixels PX in a former row. The number of pixels PX in a present row, in the rows between the f-th row ROW_f and the a-th row ROW_a, may be equal to or less than the number of pixels PX in a former row.

The number of pixels PX in a present row, in the rows between the a-th row ROW_a and the q-th row ROW_q, may be equal to or greater than the number of pixels PX in a former row. The number of pixels PX in a present row in the rows between the u-th row ROW_u and the m-th row ROW_m may be equal to or less than that of pixels PX in a former row. The pixels PX may be vertically symmetrical to each other in the second direction DR2 with respect to the a-th row ROW_a.

L data lines may be in each of the first areas A1 of the a-th row ROW_. Straight data lines SDL may extend in the second direction DR2 and be connected to the pixels in a corresponding column of the columns COL_1 to COL_n. Bent data lines BDL may be bent at least two times and may extend from the second direction DR2 to the first direction DR1 and from the first direction D1 to the second direction DR2 and be connected to the pixels in a corresponding column of the columns COL_1 to COL_n.

Since k=7 and n=s 14, L is 2. Two data lines may be in each of the first areas A1 of the a-th row ROW_a, and the data lines may extend in the second direction DR2 on the first areas A1.

The pixels PX may not be bilaterally symmetrical to each other. For example, the pixels PX in the row on the right area of the display panel 310 may have the same number, and the pixels in the rows on the left area of the display panel 310 may have numbers different from each other. Thus, the value d provided as an example in FIGS. 4A and 4B may not exist, and only the value c may exist.

In this case, in the first row ROW_1 to the q-th row ROW_q, the data lines having the same number as a difference between the number of pixels PX in the h-th row and the number of pixels PX in the h+1-th row may extend in the first direction DR1 between the pixels PX in the h-th row and the pixels PX in the h+1-th row, where z is a natural number.

The bent data lines BDL in the first areas A1 successively extend from the second direction DR2 to the first direction DR1 from the first bent data line BDL1 of the bent data lines BDL. The bent data lines BDL, bent from the second direction DR2 to the first direction DR1, may be successively bent from the first direction DR1 to the second direction DR2.

For example, in the f-th row ROW_f to the a-th row ROW_a, when a difference value between the number of pixels PX in the h-th row and the number of pixels PX in the h+1-th row is z, z bent data lines BDL may extend in the first direction DR1 between the pixels PX in the h-th row and the pixels PX in the h+1-th row. Each of the z bent data lines BDL extending in the first direction DR1 may extend from the first direction DR1 to the second direction DR2 and be connected to the pixels PX in a corresponding column of the columns COL1 to COLn.

For example, a difference between the number of pixels PX in an a−1-th row and the number of pixels PX in the a-th row ROW_a may be 3. The first to third bent data lines of the bent data lines BDL extending in the second direction DR2 on the first areas A1 may successively extend in the first direction DR1 between the pixels PX in the a−1-th row and the a-th row ROW_a.

The first to third bent data lines extending in the first direction DR1 may successively extend from the first direction DR1 to the second direction DR2. Each of the first to third bent data lines BDL extending from the first direction DR1 to the second direction DR2 may be connected to the pixels PX in the corresponding column.

The number of pixels PX in an a−2th row and the number of pixels PX in the a−1-th row may be the same. Thus, the bent data line BDL extending in the first direction DR1 between the pixels PX in the a−2-th row and the pixels PX in the a−1-th row do not exist.

In other or remaining rows, except for the a-th to a−2-th rows of the f-th row ROW_f to the a-th row ROW_a, the bent data lines BDL except for the first to third bent data lines may extend from the second direction DR2 to the first direction DR1 in the same manner, and then extend in the second direction DR2. This manner may be substantially the same as the extending manner of the data lines DL1 to DLn described with reference to FIGS. 4A and 4B.

Also, in the e-th row ROW_e to the first row ROW_1, when a difference value between the number of pixels PX in the h-th row and the number of pixels PX in the h+1-th row is z, the bent data lines BDL extend in the first direction DR1 between the pixels PX in the h-th row and the pixels PX in the h+1-th row. For example, since a difference between the number of pixels PX in the e−1-th row and the e-th row ROW_e and the number of pixels PX in the e−2-th row and the e−1-th row is 1, one bent data line BDL extends in the first direction between the pixels PX in the e−1-th row and the pixels PX in the e-th row ROW_e and between the pixels PX in the e−2-th row and the pixels in the e−1-th row. Other bent data lines BDL may be connected in the same manner.

In the e-th row ROW_e to the first row ROW_1, the bent data lines BDL may successively extend from the second direction DR2 to the first direction DR1 from the bent data line BDL at the most left side. For example, the bent data line BDL extending in the second direction DR2 between the pixels PX in the first column COL_1 of the e-th row ROW_e and the pixels PX in the second column may extend in the first direction DR1 between the pixels PX in the e−1-th row and the pixels PX in the e-th row ROW_e.

Next, the bent data lines BDL extending in the second direction DR2 between the pixels PX in the second column of the e-th row ROW_e and the pixels PX in the third column may extend in the first direction DR1 between the pixels PX in the e−2-th row and the pixels PX in the e−1-th row. Other bent data lines BDL may be connected in the same manner.

In the e-th row ROW_e to the first row ROW_1, the bent data lines BDL extending in the first direction DR1 may extend in the second direction DR2 at positions corresponding to positions of the bent data lines BDL in the a-th row ROW_a. For example, a v-th bent data line BDLv is adjacent to a right side of the pixel PX of the n-th column COLn of the a-th row ROW_a.

In the e-th row ROW_e to the first row ROW_1, the v-th bent data line BDLv extending in the first direction DR1 may be adjacent to the right side of the pixels PX in the n-th column COLn of the −e1-th row ROW_e−1 to the first row ROW_1 to extend in the second direction. Other bent data lines BDL may be connected in the same manner. In on embodiment, in the e-th row ROW_e to the first row ROW_1 the bent data lines BDL extending in the first direction DR1 may be in various columns of the e-th row ROW_e to the first row ROW_1 to extend in the second direction DR2.

In the a-th row ROW_a to the q-th row ROW_q, when a difference value between the number of pixels PX in the h-th row and the number of pixels PX in the h+1-th row is z, z bent data lines BDL may extend in the first direction DR1 between the pixels PX in the h-th row and the pixels PX in the h+1-th row. Thereafter, the straight data lines SDL may extend in the second direction DR2 and be connected to the pixels PX in a corresponding row. This manner may be substantially the same as that described with reference to FIGS. 4A and 4B.

The second distance GP2 between the pixels PX in the rows adjacent to each other in the second direction DR2 on the display panel 310 is equal to or greater than that obtained by multiplying a pitch PT by the maximum value of a difference value in number of pixels in the rows adjacent to each other in the first row ROW_1 to the q-th row ROW_q of the display panel 110. For example, in the first row ROW_1 to the q-th row ROW_q, since the maximum value of the difference value in number of pixels PX in the rows adjacent to each other is 3, the second distance GP2 is equal to or greater than that obtained by multiplying the pitch PT by 3.

The data lines DL1 to DLn from the q-th row ROW_q to the m-th row ROW_m extend in the second direction DR2. However, in the e-th row ROW_e to the first row ROW_1, the bent data lines BDL extends from the second direction DR2 to the first direction DR1 and then extends from the second direction DR2 to the first direction DR1. The data lines DL1 to DLn may be connected to the data driver 330 adjacent to the first row ROW_1 via a space between the pixels PX of the first row ROW_1.

The data lines DL1 to DLn having a predetermined number may be between the pixels PX of the first row ROW_1 and connected to the data driver 330 to reduce the bezel area of the display apparatus 300.

Figure 15A:
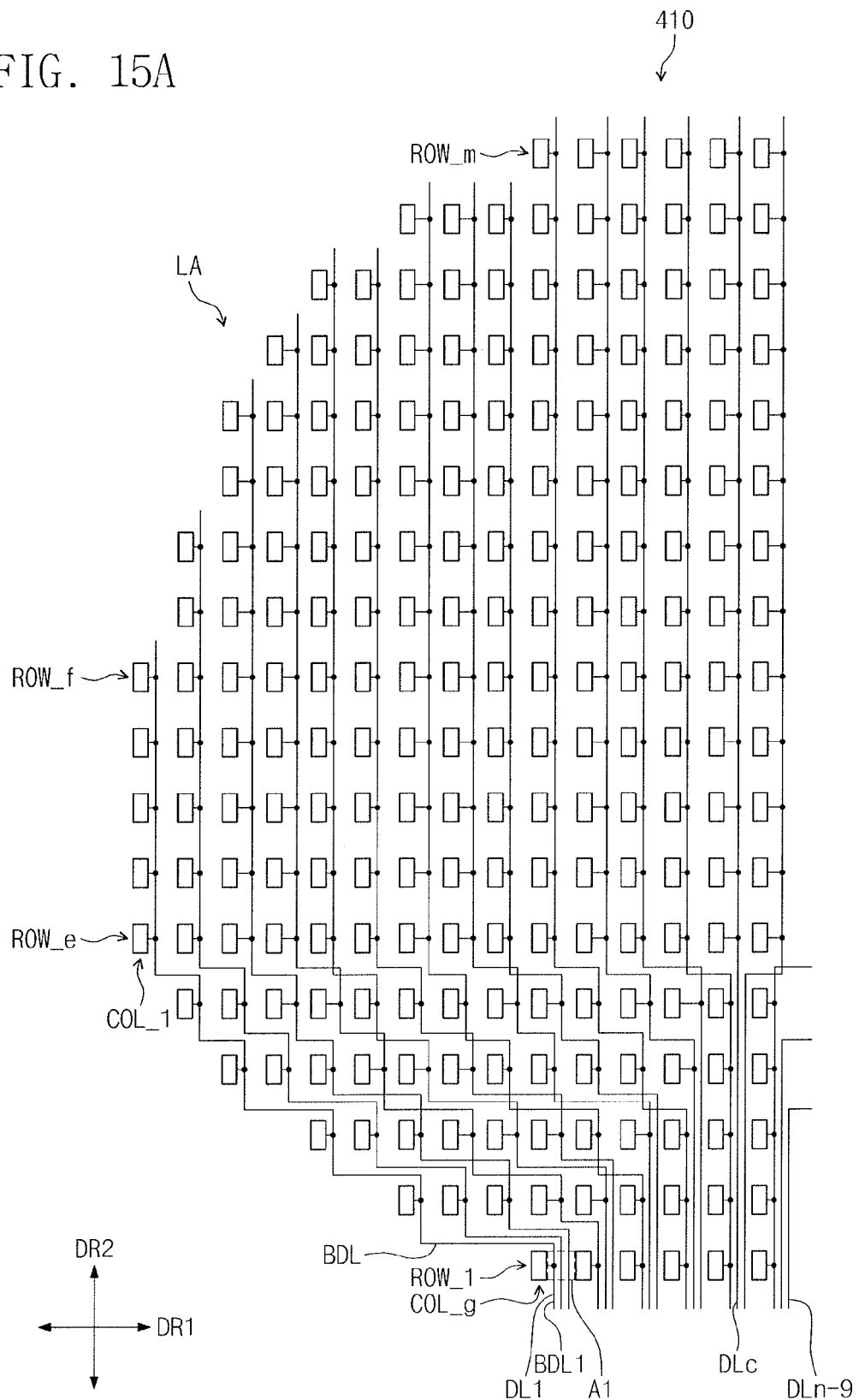
FIGS. 15A and 15B illustrate an embodiment of a connection between data lines and pixels.
Figure 15B:
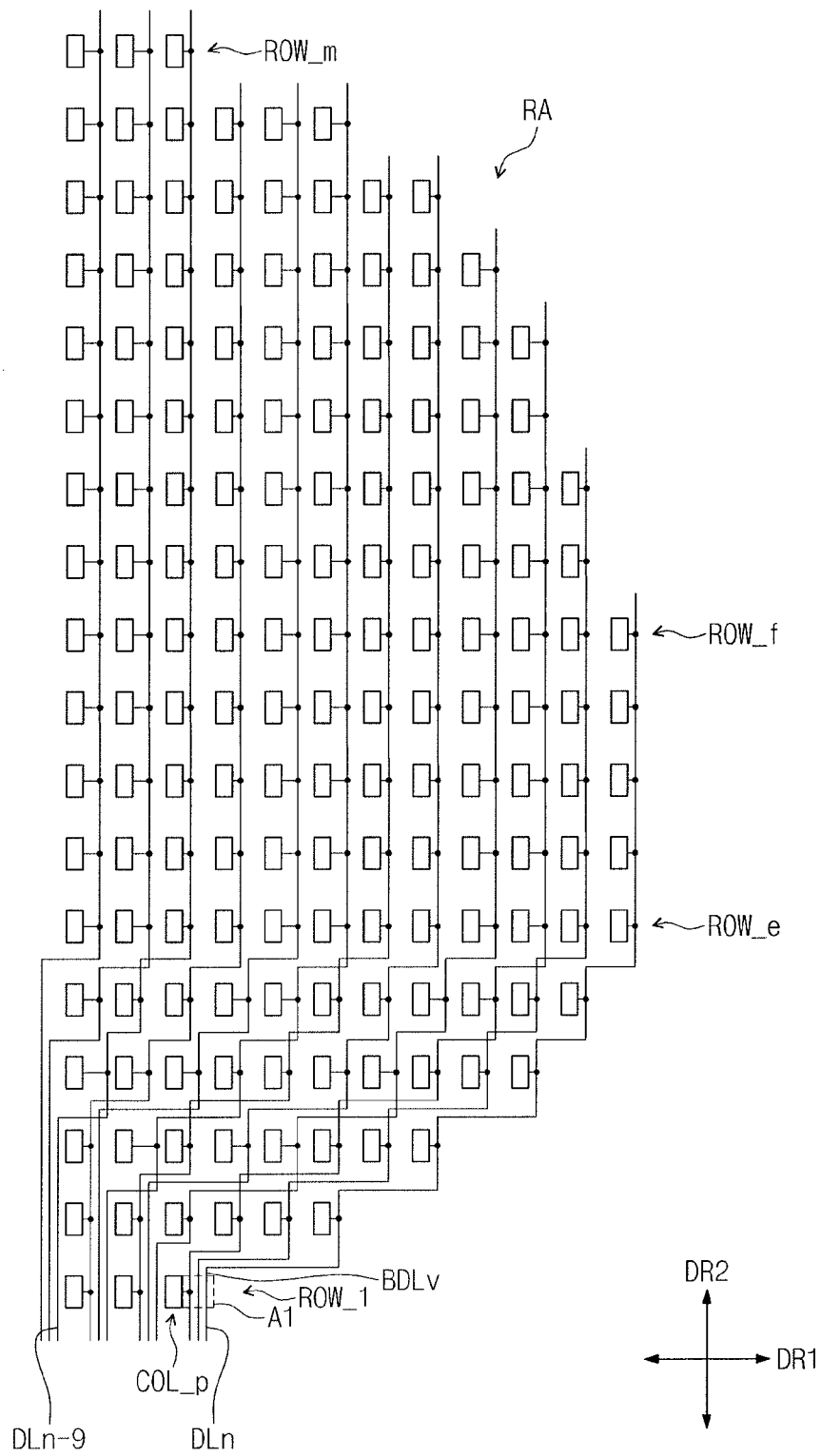
Figure 16:
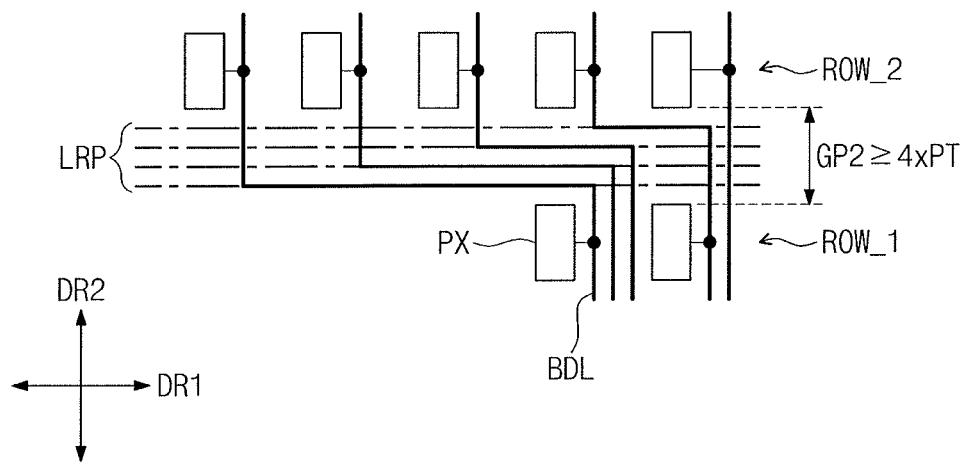
FIGS. 16 to 18 illustrate another embodiment of a distance between pixels in rows.
Figure 17:
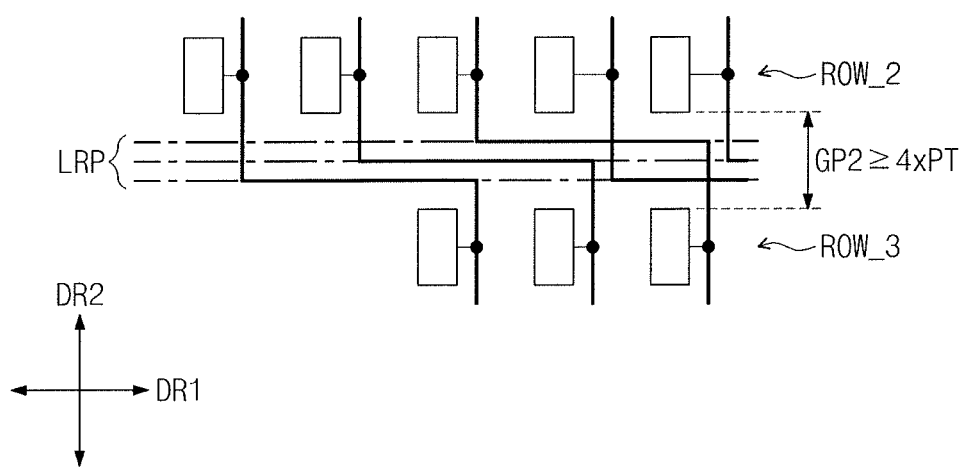
Figure 18:
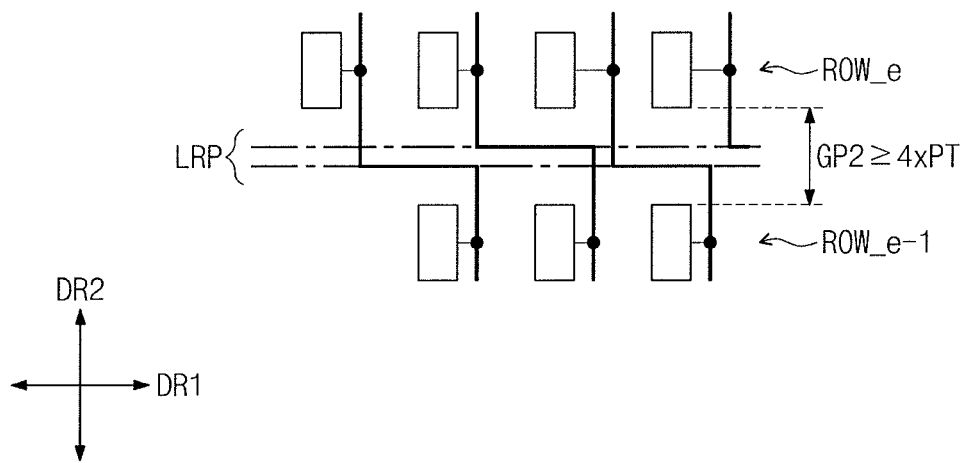

FIGS. 15A and 15B illustrate another embodiment of a connection between data lines and pixels of a display panel. FIGS. 16 to 18 illustrate an example of a distance between the pixels in the rows adjacent to each other in the second direction in FIGS. 15A and 15B. For example, FIG. 15A illustrates pixels PX in a central portion and a left area LA of a display panel 410. FIG. 15B illustrates the pixels PX in a right area RA of the display panel 410. Each of FIGS. 16 to 18 illustrates examples of pixels PX in two rows on the left area LA of the display panel 410 and in a first row ROW_1 to an e-th row ROW_e.

Referring to FIGS. 15A and 15B, pixels PX are arranged in a plurality of rows ROW_1 to ROW_m and a plurality of columns COL_1 to COL_n. The arrangement of pixels PX may be substantially the same as the pixels PX in FIGS. 4A and 4b.

L data lines may be in each of first areas A1 of the first row ROW_1. In FIGS. 15A and 15B, since k=9 and n=28, L may be 3. The data lines DL1 to DLn extend in the second direction DR2 on the first areas A1. An intermediate data line DLc of the data lines DL1 to DLn extends in the second direction DR2. Other or remaining data lines, except for the intermediate data line DLC, may be bent data lines BDL.

In the first row ROW_1 to the e-th row ROW_e, the bent data lines BDL may be bent at least two times and may extend from the second direction DR2 to the first direction DR1, and then from the first direction DR1 to the second direction DR2. The bent data lines BDL extend from the e-th row ROW_2 in the second direction DR2. The bent data lines BDL may have a bent shape that is symmetrical to each other with respect to the intermediate data line DLc.

For example, in the first row ROW_1 to the e-th row ROW_e, the bent data line adjacent to a left side of the intermediate data line DLc may be bent to extend from an upward direction of the second direction DR2 to a left direction of the first direction DR1, and then from the left direction of the first direction DR1 to the upward direction of the second direction DR2. In the first row ROW_1 to the e-th row ROW_e, the bent data line adjacent to a right side of the intermediate data line DLc may be bent to extend from an upward direction of the second direction DR2 to a right direction of the first direction DR1, and then from the right direction of the first direction DR1 to the upward direction of the second direction DR2.

In the first row ROW_1 to the e-th row ROW_e, a first bent data line BDL1 may repeatedly extend in an upward direction of the second direction DR2, the left direction of the first direction DR1, and the upward direction of the second direction DR2. In the first row ROW_1 to the e-th row ROW_e, a v-th bent data line BDLv may repeatedly extend in the upward direction of the second direction DR2, the right direction of the first direction DR1, and the upward direction of the second direction DR2.

Thus, the bent configuration of the bent data line adjacent to the left side of the intermediate data line DLc and the bent data line adjacent to the right side of the intermediate data line may be symmetrical to each other. Also, the bent configuration of the first bent data line BDL1 and the v-th bent data line BDLv may be symmetrical to each other. Also, the bent configuration of other bent data lines BDL may be symmetrical to each other with respect to the intermediate data line DLc.

In the first row ROW_1 to the e-th row ROW_e, the bent data lines BDL having a predetermined number of the bent data lines BDL may extend in the first direction DR1 between the pixels PX in the h-th row and the h+1-th row. In the first row ROW_1 to the e-th row ROW_e, as the number of rows increases, the number of bent data lines BDL extending from the second direction DR2 to the first direction DR1 may increase. For example, although the number of bent data lines extending in the first direction DR1 between the pixels PX in the first row ROW_1 and the pixels PX in the second row is 8, the number of bent data lines BDL extending in the first direction DR1 between the pixels PX in the second row and the pixels PX in the third row increases to 14.

As the number of rows increases, the number of bent data lines BDL extending in the first direction DR1 may increase. The number of bent data lines BDL extending in the first direction between the pixels PX in the e−1-th row and the pixels PX in the e-th row ROW_e may be increased or maximized.

Each of the bent data lines BDL extending in the first direction between the pixels PX in an h-th row and the pixels PX in an h+1-th row may be connected to the pixels PX in a t-th column corresponding to extend in the second direction between the corresponding t-th column and a t+1-th column of columns of the h+1-th row. For example, four bent data lines extending in the first direction between the pixels PX in the first row ROW_1 and the pixels in the second row may be respectively disposed between first and second columns, between second and third columns, between third and fourth columns, and between fourth and fifth columns of the columns of the second row to extent in the second direction DR2.

The bent data lines extending in the second direction DR2 are respectively connected to the pixel PX in the first column, the pixel PX in the second column, the pixel in the third column, and the pixel PX in the fourth column of the columns of the second row. Other bent data lines BDL may also extend in the same manner and be connected to the pixels PX.

Each of the pixels PX in each of the rows in the first row ROW_1 to the e−1-th row may be connected to a corresponding bent data line BDL of the bent data line BDL. The intermediate data line DLc may not be connected to the pixels PX in the first row ROW_1 to the e−1-th row. In the e-th row ROW_e to the m-th row ROW_m, the data lines DL1 to DLn extend in the second direction DR2 and are connected to the pixels in a corresponding column of the columns COL1 to COLn.

Referring to FIGS. 16 to 18, a second distance GP2 between the pixels PX in the rows adjacent to each other in the second direction DR2 on the display panel 410 may be equal to or greater than that obtained by multiplying a pitch PT by a value calculated by adding one to the maximum value of a difference value in number of pixels PX in the rows adjacent to each other on a left area LA of the display panel 410 and in the first row ROW_1 to the e-th row ROW_e or a difference value in number of pixels PX in the rows adjacent to each other on a right area RA of the display panel 410 and in the first row ROW_1 to the e-th row ROW_e.

The maximum value of the difference value in number of pixels PX in the rows adjacent to each other on the left area LA of the display panel 410 and in the first row ROW_1 to the e-th row ROW_e and the difference value in number of pixels PX of the display panel 410 adjacent to each other on the right area RA and in the first row ROW_1 to the e-th row ROW_e is 3. Thus, the second distance GP2 is equal to or greater than that obtained by multiplying the pitch PT by 4.

When h=1, as illustrated in FIG. 16, the second distance GP2 between the pixels PX in the first row ROW_1 and the pixels PX in the second row ROW_2 may be equal to or greater than that obtained by multiplying the pitch PT by 4. When h=2, as illustrated in FIG. 17, the second distance GP2 between the pixels PX in the second row ROW_2 and the pixels PX in the third row ROW_3 may be equal to or greater than that obtained by multiplying the pitch PT by 4.

When h is e−1, as illustrated in FIG. 18, the second distance GP2 between the pixels PX in an e−1-th row ROW_e−1 and the pixels PX in an e-th row ROW_e may be equal to or greater than that obtained by multiplying the pitch PT by 4. The second distance GP2 between the pixels PX in the rows adjacent to each other in other or remaining rows of the display panel 410 may also be equal to or greater than that obtained by multiplying the pitch PT by 4.

As described in FIGS. 4A and 4B, a difference value between the number of pixels PX in the first row ROW_1 to the e-th row ROW_e of the display panel 410 and in the h-th row on the left and right areas LA and RA and the number of pixels PX in the h+1-th row may be c and d. In FIGS. 15A and 15B, since the pixels PX are bilaterally symmetrical to each other, c and d may have the same value.

In this case, line routing parts LRP having the same number as that obtained by adding 1 to one value of c and d may be defined between the pixels PX in the h-th row and the pixels PX in the h+1-th row. The line routing part LRP extends in the first direction DR1. (For convenience of description, the line routing parts LRP are illustrated by dashed dotted lines in FIGS. 16 and 18). Each of the line routing parts LRP may have, for example, the same width as that WD of each of the data lines.

As illustrated in FIG. 16, a difference value between the number of pixels PX in the first row ROW_1 and the number of pixels in the second row ROW_2 on the left area LA of the display panel 410 is 3. Thus, fourth line routing parts LRP may be between the pixels PX in the first row ROW_1 and the pixels PX in the second row ROW_2.

As illustrated in FIG. 17, a difference value between the number of pixels PX in the second row ROW_2 and the number of pixels in the third row ROW_3 on the left area LA of the display panel 410 is 2. Thus, three line routing parts LRP may be between the pixels PX in the second row ROW_2 and the pixels PX in the third row ROW_3.

As illustrated in FIG. 18, a difference value between the number of pixels PX in the e-1-th row ROW_e-1 and the number of pixels in the e-th row ROW_e on the left area LA of the display panel 410 is 1. Thus, two line routing parts LRP may be between the pixels PX in the e-1-th row ROW_e-1 and the pixels PX in the e-th row ROW_e.

When the pixels PX are not bilaterally symmetrical to each other, c and d may have values different from each other. In this case, the line routing parts LRP having the same number as that obtained by adding 1 to a relatively large value of c and d may be between the pixels PX in the h-th row and the pixels PX in the h+1-th row.

The bent data lines BDL extending in the first direction DR1 extend via the line routing parts LRP. For example, as illustrated in FIG. 16, the bent data lines BDL extending in the first direction DR1 between the pixels PX in the first row ROW_1 and the pixels in the second row ROW_2 may extend via four line routing parts LRP.

As illustrated in FIG. 17, the bent data lines BDL extending in the first direction DR1 between the pixels PX in the second row ROW_2 and the pixels in the third row ROW_3 may extend via three line routing parts LRP. As illustrated in FIG. 18, the bent data lines BDL extending in the first direction DR1 between the pixels PX in the e-1-th row ROW_e-1 and the pixels PX in the e-th row ROW_e may extend via two line routing parts LRP.

In the display panel 410 of FIGS. 15A and 15B, since L data lines DL1 to DLn are between the pixels PX of the first row ROW_1, the bezel area may be reduced.

Example embodiments have been disclosed herein, and although specific terms are employed, they are used and are to be interpreted in a generic and descriptive sense only and not for purpose of limitation. In some instances, as would be apparent to one of ordinary skill in the art as of the filing of the present application, features, characteristics, and/or elements described in connection with a particular embodiment may be used singly or in combination with features, characteristics, and/or elements described in connection with other embodiments unless otherwise indicated. Accordingly, various changes in form and details may be made without departing from the spirit and scope of the embodiments set forth in the claims.

What is claimed is:

1. A display apparatus, comprising:
a display panel including:
a plurality of pixels arranged in rows and columns;
a plurality of gate lines in a first direction and connected to the pixels; and
a plurality of data lines connected to the pixels, wherein k pixels are the total number of pixels in an a-th row of the rows, n pixels are the total number of pixels in each of an e-th row to an f-th row of the rows between a first row and an m-th row that is a last row, and a total number of pixels greater than k and less than n are in each of other or remaining rows, where a, k, e, f, m, and n are natural numbers and f is equal to or greater than e, and
wherein L data lines are disposed in each of first areas between pixels in the a-th row and adjacent to one side of a pixel in either the first column or the last column of the a-th row, wherein L is based on a value obtained by dividing n by k, and wherein L is a natural number.

2. The display apparatus as claimed in claim 1, wherein the k pixels are in the m-th row.

3. The display apparatus as claimed in claim 1, wherein the display panel has a circular shape.

4. The display apparatus as claimed in claim 1, wherein a equals 1.

5. The display apparatus as claimed in claim 4, wherein:
in the rows between the first row and the e-th row, the total number of pixels in a present row is equal to or greater than the total number of pixels in a former row, and
in the rows between the f-th row and the m-th row, the total number of pixels in a present row is equal to or less than the total number of pixels in a former row.

6. The display apparatus as claimed in claim 4, wherein:
the data lines include a plurality of data line groups that respectively include the L data lines,
straight data lines are first data lines of each of the data line groups;
bent data lines are data lines except for the straight data lines, and
the data lines extend in a second direction crossing the first direction in the first areas, the straight data lines extend in the second direction, the bent data lines extend in the second direction, the first direction, and the second direction in the first row to the e-th row to extend from the e-th row in the second direction, the first direction corresponds to a row direction, and the second direction corresponds to a column direction.

7. The display apparatus as claimed in claim 6, wherein:
the k pixels in the first row are in a g-th column to a p-th column between a first column and an n-th column that is a last column of the columns, and
each of the straight data lines is connected to pixels in a corresponding column of the g-th column to the p-th column, with g, p, and n being natural numbers.

8. The display apparatus as claimed in claim 7, wherein the first areas are between the pixels in the first row and adjacent to a right side of the p-th column of the first row.

9. The display apparatus as claimed in claim 7, wherein:
the bent data lines in a first section of the display panel successively extend from the second direction to the first direction and increase in order from a first bent data line toward a center of the display panel, and
the bent data lines in a second section of the display panel, adjacent to the first section of the display panel, successively extend from the second direction to the first direction and decrease in order from a v-th bent data line that is the last bent data line toward the center of the display panel.

10. The display apparatus as claimed in claim 9, wherein:
the bent data lines extending in the first direction successively extend from a first bent data line and successively extend from the first direction to the second direction from a v-th bent data line, and
each of the bent data lines extending from the first direction to the second direction is connected to the pixels in a corresponding column of the first column to a g−1-th column and a p+1-th column to the n-th column.

11. The display apparatus as claimed in claim 10, wherein the bent data lines extending from the first direction to the second direction are successively connected by a column unit to the pixels in the g−1-th column to the first column and successively connected by the column unit to the pixels in the p+1-th column to the n-th column from the v-th bent data line.

12. The display apparatus as claimed in claim 6, wherein:
in the first row to the e-th row, when the total number of pixels disposed in an h-th row and the total number of pixels disposed in an h+1-th row are different from each other, bent data lines having a same number as a difference value between the total number of pixels in the h-th row and the total number of pixels in the h+1-th row of the bent data lines extend in the first direction between the pixels in the h-th row and the pixels in the h+1-th row, where h is a natural number.

13. The display apparatus as claimed in claim 6, wherein:
in a left area of the display panel, which is an area of the display panel at a left side with respect to a central portion of the display panel in the first direction and the first row to the e-th row, when the total number of pixels in an h+1-th row is greater by c than the total number of pixels in an h-th row, c bent data lines extend in the first direction between the pixels in the h-th row and the pixels in the h+1-th row, and
in a right area of the display panel, which is an area of the display panel at a right side with respect to the central portion of the display panel in the first direction and the first row to the e-th row, when the total number of pixels in the h+1-th row is greater by d than the total number of pixels in the h-th row, d bent data lines extend in the first direction between the pixels in the h-th row and the pixels in the h+1-th row.

14. The display apparatus as claimed in claim 13, wherein:
the data lines adjacent to each other of the L data lines in each of the first areas are spaced a first distance from each other in the first direction and have a predetermined width in the first direction, and
a pitch corresponding to a distance between sides of the data lines adjacent to each other is determined as a value obtained by adding the first distance to the width.

15. The display apparatus as claimed in claim 14, wherein:
a second distance, between the pixels adjacent to each other in the second direction in the display panel, is equal to or greater than a value obtained by multiplying the pitch by a maximum value of a difference value in the total number of pixels in the rows adjacent to each other on a left area of the display panel and in the first row to the e-th row or a difference value in the total number of pixels in the rows adjacent to each other in the right area of the display panel and the first row to the e-th row.

16. The display apparatus as claimed in claim 6, wherein a data line in the second direction crosses at least one data line in the first direction.

17. The display apparatus as claimed in claim 16, wherein the at least one data line in the first direction includes:
a bridge electrode spaced apart from the one data line in the second direction with an insulation layer therebetween; and
first and second sub lines spaced apart from each other with the one data line extending in the second direction therebetween, wherein the bridge electrode electrically connects the first sub line to the second sub line.

18. The display apparatus as claimed in claim 1, further comprising:
a gate driver connected to the gate lines to apply a plurality of gate signals to the gate lines; and
a data driver adjacent to the first row and connected to the data lines to apply a plurality of data voltages to the data lines.

19. A display apparatus, comprising:
a display panel including:
a plurality of pixels arranged in rows and columns;
a plurality of gate lines extending in a first direction and connected to the pixels; and
a plurality of data lines connected to the pixels, wherein k pixels are the total number of pixels in an a-th row of the rows, n pixels are the total number of pixels in each of an e-th row to an f-th row of the rows between a first row and an m-th row that is a last row, and a total number of pixels greater than k and less than n are in each of other or remaining rows, where a, k, e, f, m, and n are natural numbers and f is equal to or greater than e, and
a value obtained by dividing n by k is L, a remaining value is b, L+1 data lines are in each of b first areas of the first areas corresponding to an area between the pixels in the a-th row and adjacent to one side of a pixel in either the first column or the last column of the a-th row.

20. The display apparatus as claimed in claim 19, wherein the L+1 data lines are successively disposed in w first areas from a leftmost side and successively in b-w first areas from a rightmost side of the first areas, where w is an integer equal to or greater than 0 and is equal to or less than b.

* * * * *